(12) United States Patent
Cho et al.

(10) Patent No.: US 8,466,375 B2
(45) Date of Patent: Jun. 18, 2013

(54) APPARATUS FOR REDUCING ELECTRIC FIELD AND RADIATION FIELD IN MAGNETIC RESONANT COUPLING COILS OR MAGNETIC INDUCTION DEVICE FOR WIRELESS ENERGY TRANSFER

(75) Inventors: In-Kui Cho, Daejeon (KR); Je-Hoon Yun, Daejeon (KR); Seong-Min Kim, Daejeon (KR); Jung-Ick Moon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 296 days.

(21) Appl. No.: 12/974,901

(22) Filed: Dec. 21, 2010

(65) Prior Publication Data
US 2012/0049986 A1   Mar. 1, 2012

(30) Foreign Application Priority Data
Aug. 25, 2010 (KR) .................. 10-2010-0082499

(51) Int. Cl.
*H05K 9/00* (2006.01)
(52) U.S. Cl.
USPC ............ 174/386; 174/396; 307/104; 320/108
(58) Field of Classification Search
USPC .... 174/386, 396; 307/104; 333/194; 320/108
See application file for complete search history.

(56) References Cited

U.S. PATENT DOCUMENTS

| | | | |
|---|---|---|---|
| 8,097,983 B2 * | 1/2012 | Karalis et al. ................. | 307/104 |
| 2004/0000974 A1 * | 1/2004 | Odenaal et al. ............... | 333/219 |
| 2006/0205381 A1 * | 9/2006 | Beart et al. .................. | 455/343.1 |
| 2007/0222542 A1 * | 9/2007 | Joannopoulos et al. ...... | 333/219 |
| 2009/0224856 A1 | 9/2009 | Karalis et al. | |
| 2010/0187913 A1 * | 7/2010 | Smith et al. ................... | 307/104 |
| 2010/0201316 A1 * | 8/2010 | Takada et al. ................. | 320/108 |
| 2010/0244579 A1 * | 9/2010 | Sogabe et al. ................. | 307/104 |
| 2010/0244580 A1 * | 9/2010 | Uchida et al. ................. | 307/104 |
| 2010/0289449 A1 * | 11/2010 | Elo .............................. | 320/108 |
| 2010/0295506 A1 * | 11/2010 | Ichikawa ...................... | 320/108 |

OTHER PUBLICATIONS

André Kurs et al., "Wireless Power Transfer via Strongly Coupled Magnetic Resonances", Science, vol. 317, pp. 83-86, Jul. 6, 2007.

* cited by examiner

*Primary Examiner* — Hung Ngo
(74) *Attorney, Agent, or Firm* — Rabin & Berdo, P.C.

(57) ABSTRACT

An apparatus for reducing a radiation power and an electric field includes a transmission end energy transfer unit configured to include a feeding roof and a transmission coil, a receiving end energy transfer unit configured to be symmetrically separated from the transmission end energy transfer unit at a predetermined distance, and to include a receiving roof and a receiving coil, a first electric field shield configured to be made of a nonconductor, to have a shape surrounding the transmission end energy transfer unit, and to have an empty space of a predetermined first thickness; and a second electric field shield to be made of a nonconductor, to have a shape surrounding the receiving end energy transfer unit, and to have an empty space of a predetermined second thickness, wherein the empty spaces are filled with a dielectric material for shielding the electric field.

20 Claims, 34 Drawing Sheets (a)

APPARATUS FOR REDUCING ELECTRIC FIELD AND RADIATION FIELD IN MAGNETIC RESONANT COUPLING COILS OR MAGNETIC INDUCTION DEVICE FOR WIRELESS ENERGY TRANSFER

CROSS-REFERENCE(S) TO RELATED APPLICATIONS

The present application claims priority of Korean Patent Application No. 10-2010-0082499, filed on Aug. 25, 2010, which is incorporated herein by reference in its entirety.

BACKGROUND OF THE INVENTION

1. Field of the Invention

Exemplary embodiments of the present invention relate to an apparatus and method for reducing a radiation power and an electric field generated around a wireless power transfer apparatus using magnetic induction and magnetic resonance.

2. Description of Related Art

Energy is a quantity as the ability to perform work. Energy is a physical term indicating heat, electricity, and power. Various types of energies have been discovered, for example, electric energy, chemical energy, water power energy, and thermal energy. Among the energies, the electric energy can be transferrable through a conductor. It is the most fundamental method of transferring the electric energy.

As another energy transfer method, an electric field has been used for generating electricity. It is a technology of transferring electricity from a $1^{st}$ coil to a $2^{nd}$ coil using induced electromotive force generated by a magnetic field and an electric field. Such a technology has been used in a power plant.

Further, a wireless energy transfer method has been introduced. It is a propagation technology transmitting a constant power signal through air. Although such a wireless energy transfer method has been widely used, it is not an effective energy transfer method.

Meanwhile, Massachusetts Institute of Technology (MIT) introduced a new wireless energy transfer technology at 2007. The MIT wireless energy transfer technology uses a magnetic resonance scheme and a magnetic induction scheme.

That is, in the MIT wireless energy transfer technology, power is transferred by inducing magnetic field resonance using two magnetic resonators having the same frequency. Hereinafter, the wireless energy transfer technology introduced by MIT will be described.

FIG. 1 is a diagram illustrating a wireless power transfer apparatus introduced by MIT.

Referring to FIG. 1, a transmission end includes a helical resonance coil 101 and a feeding roof 102 for transmission impendence matching. A receiving end includes elements corresponding to the transmitting end. The receiving end includes a helical resonant coil 103 and a receiving roof 104.

MIT set manufacturing conditions of the helical resonant coil 101 of FIG. 1 as follows.

A diameter (d) of the helical coil 101 is about 60 cm, and the number of turns (n) in the helical coil is 5.25. The height (h) of the helical coil is 20 cm, and a thickness of a line of the helical coil is 6 mm. The feeding roof 102 and the receiving roof 104 are manufactured to have a diameter of 50 cm which is slightly smaller than the helical coils 101 and 103. In this case, a resonant frequency between two helical coils 101 and 103 is about 10.0560.3 MHz.

In the transmission end, the feeding roof 102 and the helical coil 101 are separated from each other at Ks. In the receiving end, the reception coil 103 and the receiving roof 104 are separated at Kd. The receiving roof 104 includes a light bulb in order to confirm that energy is transmitted to air.

However, such as resonance structure generates a radiation power about −11 dBi, and a strong electric field is formed with a magnetic field between two resonant devices. Such a strong electric field is very harmful to human body. Accordingly, it is difficult to commercially use such a technology.

SUMMARY OF THE INVENTION

An embodiment of the present invention is directed to an apparatus and method for reducing an electric field and a radiation power in a wireless energy transfer device, a magnetic induction device, or a magnetic resonance device.

Another embodiment of the present invention is directed to an apparatus and method for reducing interference in a wireless energy transfer apparatus, a magnetic induction device, and a magnetic resonance device.

Still another embodiment of the present invention is directed to an apparatus and method for providing stability by reducing an electric field radiated from a wireless energy transfer apparatus, a magnetic induction device, and a magnetic resonance device.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, an apparatus for reducing an electric field and a radiation power in a magnetic resonator for wireless energy transfer, includes: a transmission end energy transfer unit configured to include a feeding roof and a transmission coil; a receiving end energy transfer unit configured to have a symmetrical structure to the transmission end energy transfer unit, to be separated from the transmission end energy transfer unit at a predetermined distance, and to include a receiving roof and a receiving coil; a first electric field shield configured to be made of a nonconductor, to have a shape surrounding the transmission end energy transfer unit, and to have an empty space of a predetermined first thickness; and a second electric field shield to be made of a nonconductor, to have a shape surrounding the receiving end energy transfer unit, and to have an empty space of a predetermined second thickness, wherein the empty spaces of the first and second electric field shields are filled with a dielectric material for shielding the electric field.

The first and second electric field shields may have a shape of hexahedron.

The first and second electric field shields may have a globular shape.

The transmission end energy transfer unit and the receiving end energy transfer unit may include a resonance coil, wherein the resonance coil may be made as a conductor plate having a predetermined width and a predetermined thickness and the resonance coil may be configured as a circular spiral structure.

The transmission end energy transfer unit and the receiving end energy transfer unit may include a resonance coil, wherein the resonance coil may be made as a conductor plate having a predetermined width and a predetermined thickness and the resonance coil may be configured as a square spiral structure.

The transmission end energy transfer unit and the receiving end energy transfer unit may include a resonance coil, wherein the resonance coil may be made as a conductor plate having a predetermined width and a predetermined thickness and the resonance coil may be configured as a circular coil structure.

The apparatus may further include: a first electric field shield disposed at a rear side in a 180° direction from the transmission end energy transfer unit, wherein the first electric field shield may be made of a nonconductor and has an area greater than the transmission coil and the feeding roof, and the first electric field shield may internally include a dielectric having a dielectric loss higher than about 0.1.

The apparatus may further include: a second electric field shield disposed at a rear side in a 180° direction from the receiving end energy transfer unit, wherein the second electric field shield may be made of a nonconductor and has an area greater than the receiving coil and the receiving roof, and wherein the second electric field shield may internally include a dielectric having a dielectric loss higher than about 0.1.

The apparatus may further include: a third electric field shield disposed at a gap between the transmission end energy transfer unit and the receiving end energy transfer unit, wherein the third electric field shield may be made of a nonconductor, and wherein the third electric field shield may internally include a dielectric having a dielectric loss equal to or higher than about 0.1.

In accordance with an embodiment of the present invention, and apparatus for reducing an electric field and a radiation power in a magnetic resonator for wireless energy transfer, includes: a transmission end energy transfer unit configured to includes a feeding roof and a transmission coil; a receiving end energy transfer unit configured to be formed symmetrical to the transmission end energy transfer unit, to be separated at a predetermined distance from the transmission end energy transfer unit, and to include a receiving coil and a receiving roof; a first electric field shield configured to be disposed at a rear side in a 180° direction from the transmission end energy transfer unit, to be made of a nonconductor, and to have an area greater than the transmission coil and the feeding roof; a second electric field shield configured to be disposed at a rear side in a 180° direction from the receiving end energy transfer unit, to be made of a nonconductor, and to have an area greater than the receiving coil and the receiving roof, wherein the first electric field shield and the second electric field shield internally include a dielectric that shields an electric field and penetrates a magnetic field.

The apparatus may further include: a third electric field shield configured to be disposed a gap between the transmission end energy transfer unit and the receiving end energy transfer unit, wherein the third electric field may internally include a dielectric that shields an electric field and penetrates a magnetic field.

The transmission end energy transfer unit and the receiving end energy transfer unit may include a resonance coil, and wherein the resonance coil may be made as a conductor plate having a predetermined width and a predetermined thickness and the resonance coil may be configured as a circular spiral structure.

The transmission end energy transfer unit and the receiving end energy transfer unit may include a resonance coil, and wherein the resonance coil may be made as a conductor plate having a predetermined width and a predetermined thickness and the resonance coil may be configured as a square spiral structure.

The transmission end energy transfer unit and the receiving end energy transfer unit may include a resonance coil, and wherein the resonance coil may be made as a conductor plate having a predetermined width and a predetermined thickness and the resonance coil may be configured as a circular coil structure.

In accordance with an embodiment of the present invention, a method for reducing an electric field and a radiation power in a magnetic resonator for wireless energy transfer, wherein the magnetic resonator includes a transmission end energy transfer unit having a feeding roof and a transmission coil and a receiving end energy transfer unit symmetrically separated from the transmission end energy transfer unit and having a receiving coil and a receiving roof, the method includes: shielding an electric field of the transmission end energy transfer unit by filling a dielectric at an empty space between an inner wall and an outer wall of a first electric field shield made of a nonconductor and having a shape entirely surrounding the transmission end energy transfer unit; and shielding an electric field of the receiving end energy transfer unit by filling a dielectric at an empty space between an inner wall and an outer wall of a second electric field shield made of a nonconductor and having a shape entirely surrounding the receiving end energy transfer unit.

The first electric field shield and the second electric field shield may be configured to have a shape of hexahedron.

The first electric field shield and the second electric field shield may be configured to have a globular shape.

In accordance with an embodiment of the present invention, a method for reducing an electric field and a radiation power in a magnetic resonator for wireless energy transfer, wherein the magnetic resonator includes a transmission end energy transfer unit having a feeding roof and a transmission coil and a receiving end energy transfer unit symmetrically separated from the transmission end energy transfer unit and having a receiving coil and a receiving roof, the method includes: disposing a first electric field shield at a rear side in a 180° direction from the transmission end energy transfer unit, wherein the first electric field shield has an area greater than the transmission coil and the feeding roof, is made of a nonconductor, and internally includes a dielectric shielding an electric field and penetrating a magnetic field; and disposing a second electric field shield at a rear side in a 180° direction from the receiving end energy transfer unit, wherein the second electric field shield has an area greater than the receiving coil and the receiving roof, is made of a nonconductor, and internally includes a dielectric shielding an electric field and penetrating a magnetic field.

The first electric field shield and the second electric field shield may be configured to have a shape of hexahedron.

The method may further include: disposing a third electric field shield at a gap between the transmission end energy transfer unit and the receiving end energy transfer unit, wherein the third electric field may be configured to have a hexahedron shape and may internally include a dielectric that shield an electric field and penetrates a magnetic field.

BRIEF DESCRIPTION OF THE DRAWINGS

FIGS. 15C and 15D are diagrams illustrating an electric field shield included with the structure of FIGS. 15A and 15B.

DESCRIPTION OF SPECIFIC EMBODIMENTS

Figure 1:
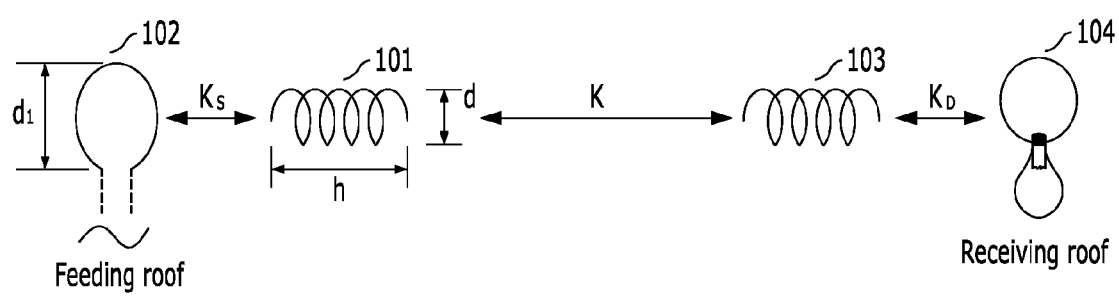
FIG. 1 is a diagram illustrating a wireless power transfer apparatus introduced by MIT.

Exemplary embodiments of the present invention will be described below in more detail with reference to the accompanying drawings.

The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. The drawings are not necessarily to scale and in some instances, proportions may have been exaggerated in order to clearly illustrate features of the embodiments.

Figure 2A:
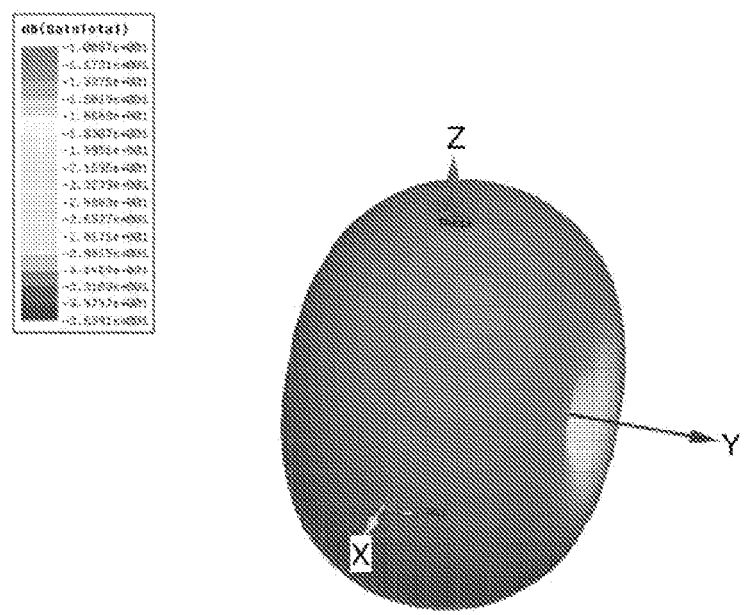
FIGS. 2A and 2B are graphs showing simulation results of a radiation power generated from a helical structure shown in FIG. 1.
Figure 2B:
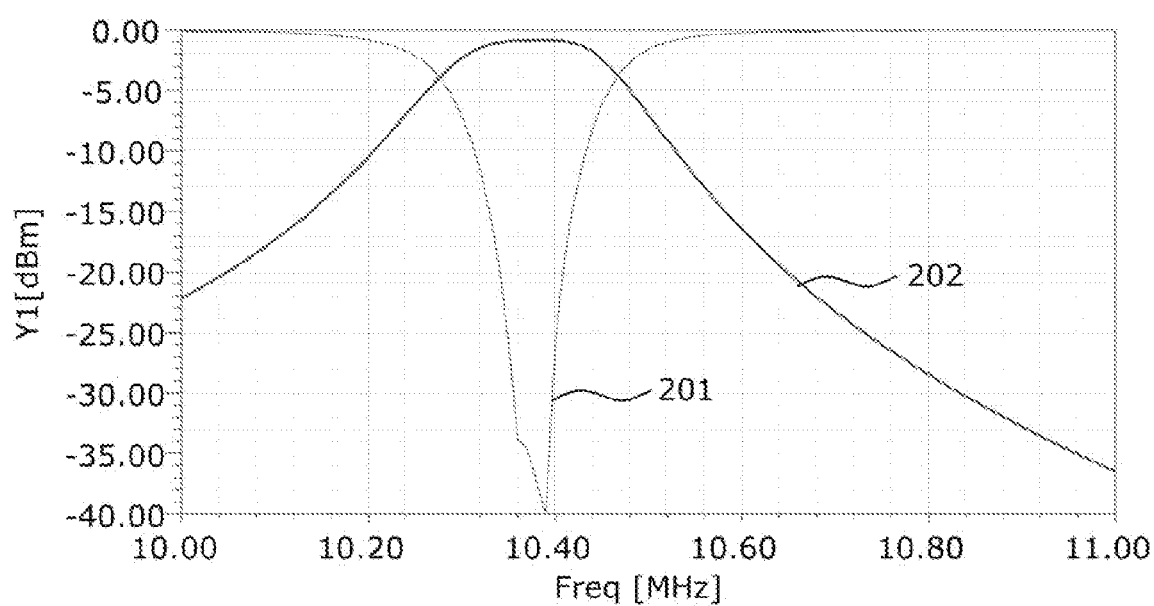

FIGS. 2A and 2B are graphs showing simulation results of a radiation power generated from a helical structure shown in FIG. 1.

Referring to FIG. 1 again, an electric field and a magnetic field are formed around the helical coil structure of FIG. 1, and power is transferred between two resonators by the combination of resonators. The shown structure generates an electric field and a magnetic field between the resonators, which could influence a human body. Further, such a structure generates radiation power, which could not be ignored. When high power is transferred, such an interference problem may become serious.

The simulation result of FIG. 2A is a graph illustrating a radiation power and a pattern thereof measured at a comparative long distance from the helical structure of FIG. 1. As shown in the simulation result graph of FIG. 2A, the power radiated from the helical structure of FIG. 1 has a very large value.

FIG. 2B is a graph illustrating a simulation result of an antenna gain generated from the helical structure of FIG. 1.

In FIG. 2B, a reference numeral 201 denotes a graph illustrating a frequency response property of S1,1 in the wireless energy transfer apparatus having the helical structure of FIG. 1. A reference numeral 202 denotes a graph illustrating a frequency response property of S2,1 in the wireless energy transfer apparatus having the helical structure of FIG. 1.

Here, the graph 201 of S1,1 using a S-parameter abruptly decreases at about 10.39 MHz according to frequency variation. As shown, the graph S1,1 shows that the resonance is generated at about 10.39 MHz and the power is maximally radiated from a transmission end to a receiving end.

Also, the graph S1,2 using a s-parameter is an analysis result when power is transferred from a $1^{st}$ port to a $2^{nd}$ port. That is, the graph illustrates a gain simulation result when power is transferred from a transmitting end to a receiving end.

An example of radiating specific electric power to the outside will be described using the simulation result graph of FIG. 2B. When the shown structure of FIG. 1 transfers electric power of about 30 dBm, a radiation power becomes about 20 dBm. Here, 30 dBm is equal to 1 W. That is, electric power about 0.1 W is radiated to air. Accordingly, when the shown structure of FIG. 1 transfers the electric power of 100 W, about 10 W is radiated to air. Due to the large amount of radiation power, it is impossible to implement a wireless energy transfer apparatus with the shown structure of FIG. 1. Further, the shown structure of FIG. 1 generates about several hundreds V/m of an electric field.

Figure 3A:
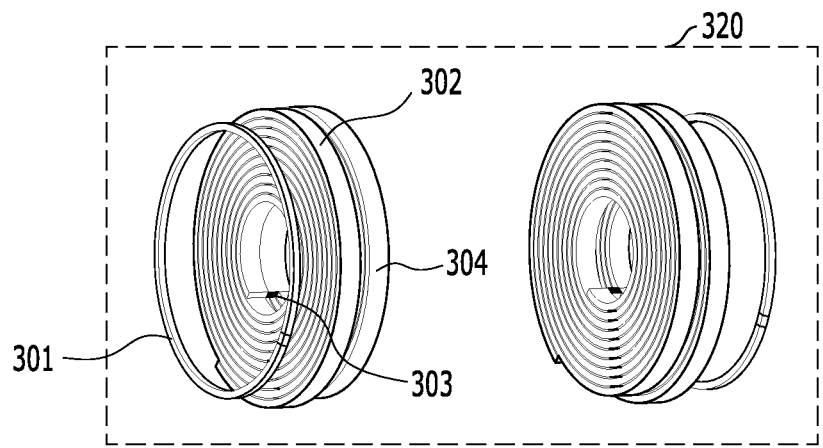
FIGS. 3A to 3C are diagrams illustrating a resonator using magnetic resonance in accordance with an embodiment of the present invention.
Figure 3B:
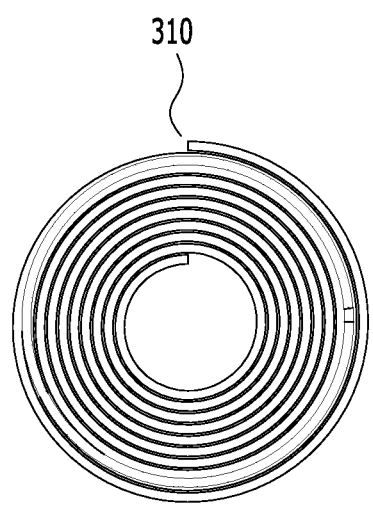
Figure 3C:
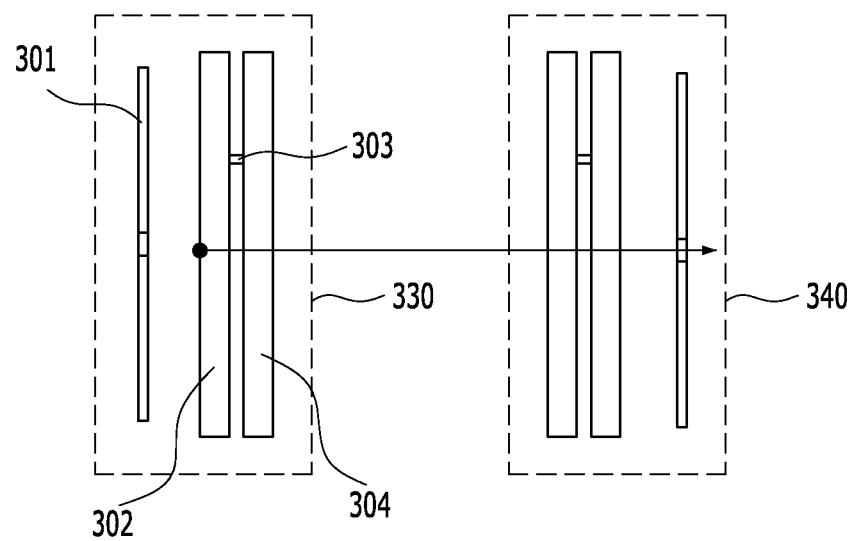

FIGS. 3A to 3C are diagrams illustrating a resonator using magnetic resonance in accordance with an embodiment of the present invention. FIG. 3A is an exploded view of a resonator in accordance with an embodiment of the present invention. FIG. 3B is a top view of the resonator of FIG. 3A. FIG. 3C is a side view illustrating one of spiral layers 302 and 304 of the resonator of FIG. 3A.

Referring to FIGS. 3A to 3C, the resonator in accordance with an embodiment of the present invention includes at least one of spiral layers 302. As shown in FIG. 3A, the resonator in accordance with an embodiment of the present invention has a helical structure formed by combining more than two spiral layers 302. Although the resonator in accordance with an embodiment of the present invention may include more than two spiral layers, the resonator in accordance with an embodiment of the present invention will be described to have two spiral layers for convenience.

Hereinafter, the spiral layers of the resonator in accordance with an embodiment of the present invention will be described. As shown in FIG. 3B, the spiral layer 310 has a predetermined empty space and a coil shape. Accordingly, the spiral layer has a thickness of a line of a coil. That is, two different spiral layers are stacked in a form of a column, thereby forming a helical structure.

Here, two different spiral layers are formed by coiling a line in opposite directions. That is, a first spiral layer is formed by coiling a line in a clockwise direction. Then, a second spiral layer is formed by coiling a line in a counter clockwise direction. Such a structure is shown in a diagram 320 in FIG. 3A. Referring to a reference numeral 303 of the diagram 320, two spiral layers are formed by coiling lines in opposite directions.

The two spiral layers are separated at a predetermined distance. Start points of the spiral layers are connected through a conductor plate 303. As described above, two spiral layers are stacked in a shape of a column, thereby forming a helical structure.

As described above, the resonator in accordance with an embodiment of the present invention includes a resonance coil having a helical structure by stacking the spiral layers. The resonator in accordance with an embodiment of the present invention further includes a feed roof 301 for supplying electric power at a predetermined distance from the resonance coil. The feeding roof 301 may have impedance matching. Accordingly, input impedance is decided by a function of a radius of a roof and a distance to the resonance coil. Accordingly, the input impedance of the feeding roof 301 is configured to be matched to 500 hm. Such a phenomenon may have a property of a transformer.

As described above, the resonance coil may have one or two spiral layers. Such a spiral layer may be formed as a plate structure. In generally, an electric power transfer distance is about two times of a diameter of the spiral layer.

The resonator in accordance with an embodiment of the present invention has the same structure for a transmission end and a receiving end. A transmission end resonator is separated from a receiving end resonator at a predetermined distance.

That is, a wireless energy transfer apparatus in accordance with an embodiment of the present invention includes the transmission end resonator and the receiving end resonator separated from each other at a predetermined distance. The transmission end resonator feeds electric power to the receiving end resonator through a resonant frequency. Such energy transfer of the wireless energy transfer apparatus in accordance with an embodiment of the present invention will be described. In FIG. 3C, a reference numeral 330 denotes a transmission end resonance coil and a reference numeral 340 denotes a receiving end resonance coil.

As described above, the wireless energy transfer apparatus in accordance with an embodiment of the present invention includes the transmission and receiving end resonance coils 330 and 340 have the helical structure formed of spiral coil layers. As described in FIG. 1, an inductance L and a capacitance c increase at the same time in such a structure. A resonant frequency is expressed as Eq. 1 as below.

$$f_0 = \frac{1}{2\pi\sqrt{LC}} \quad \text{Eq. 1}$$

When two conductors are arranged in parallel, the capacitance c is generated as shown in Eq. 2 below.

$$C \propto \frac{\varepsilon_r}{\ln(d/a)} \quad \text{Eq. 2}$$

As shown, Eq. 2 requires a dielectric constant that decides a molecule value for obtaining a sufficient capacitance value c. Accordingly, it is preferable to insert a dielectric. In case of inserting a dielectric, a resonant frequency can be reduced as much as $\sqrt{\varepsilon_r}$ of a relative permittivity as shown in Eq. 1.

For example, when a relative permittivity is about 9, a resonant frequency may be reduced by about 3 times in comparison with a structure not including a dielectric. Here, the structure not including a dielectric has a dielectric constant of 1. Such a dielectric is disposed between two metal plates. As shown in Eq. 2, it may be advantageous if a distance between two lines is reduced and a thickness of a line is increased. On the contrary, the number of coil turns and a cross-sectional area of a coil are increased and a thickness (h) of a line is reduced in order to increase the inductance L.

For the selection of a structure, a spiral structure has a greater inductance L than a helical structure when they have the same size. For example, the MIT helical structure of FIG. 1 has 20 uH of an inductance value L. On the contrary, a spiral structure having the same diameter of the MIT helical structure has about 40 uH of an inductance value L. Accordingly, the spiral structure is advantageous in miniaturization and planarization. That is, the spiral structure allows forming a resonator in a board structure.

Figure 4A:
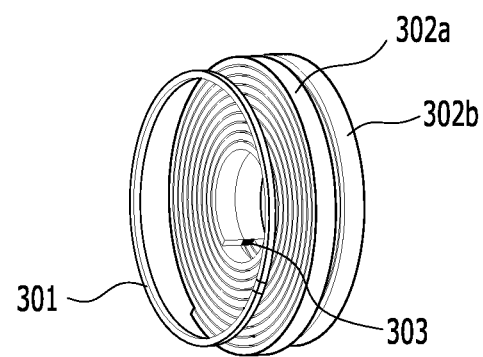
FIGS. 4A and 4B are diagrams for describing a method of connecting resonance coils having a spiral structure in accordance with an embodiment of the present invention.
Figure 4B:
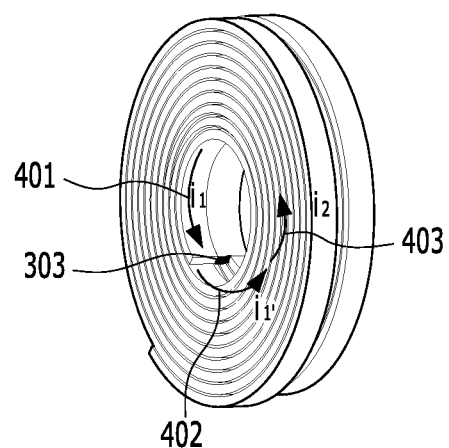

FIGS. 4A and 4B are diagrams for describing a method of connecting resonance coils having a spiral structure in accordance with an embodiment of the present invention.

FIG. 4A illustrates a resonance coil, a transmission coil, and a reception coil. For example, FIG. 4A shows a transmission end resonator. The transmission end resonator of FIG. 4A has the same structure shown in FIG. 3 except reference numbers 302a and 302b. Unlike FIG. 3, the reference numerals 302a and 302b are assigned to spiral layers.

FIG. 4B illustrates a stacking structure of two spiral layers and current directions of electric power induced at the spiral layers.

As described above, the two different spiral layers are formed by coiling a line in opposite directions. It is assumed that a first spiral layer 302a is adjacent to the transmission coil and a second spiral layer 302b is far away from the transmission coil.

As shown in FIG. 4B, the first spiral layer 302a is coiled in a clockwise direction. That is, the first spiral layer 302a is coiled from an inside to an outside thereof, and the second spiral layer 302b is coiled from an outside to an inside thereof. As shown, it is required to configure the two different spiral layers by coiling a line in opposition directions. A start point of the first spiral layer 302a is connected to a start point of the second spiral layer 302b through a conductor plate 302.

The reason of coiling the first and second spiral layers 302a and 302b in opposition directions is to avoid reduction of magnetic force lines and to compensate each other by crossing current flows. Accordingly, the magnetic force lines are reduced and compensated to each other by rotating a substrate of the first spiral layer 302a 180° from a substrate of the second spiral layer 302b and connecting them together.

Such a connection is necessarily required to increase an overall impedance L and to reduce a resonant frequency. A current $i_1$ is induced and flows on the first spiral layer 302a. The current $i_1$ flows through a coil of the first spiral layer as shown in a reference numeral 401 of FIG. 4B.

A current $I_1'$ flows through a conductor plate connecting the first spiral layer 302a to the second spiral layer 302b. The current $I_1'$ flows from the first spiral layer 302a to the second spiral layer 302b along the conductor plate as shown in a reference numeral 402 of FIG. 4B.

Since the second spiral layer 302b and the first spiral layer 302a are connected in the opposite direction, the current flows from the first spiral layer 302a to the second spiral layer 302b through the conductor plate 303 in the same direction $i_2$.

That is, when the current $i_1$ flows on the first spiral layer 302a in a counter clockwise direction, the current $i_2$ also flows on the second spiral layer 302b in the counter clockwise direction through the current $I_1'$ flowing passing the conductor plate 303.

Here, the magnetic fields generated by the current become compensated to each other when the first spiral layer 302 and the second spiral layer 302b are connected at a location where a x-axis and a y-axis have the same value.

Figure 5A:
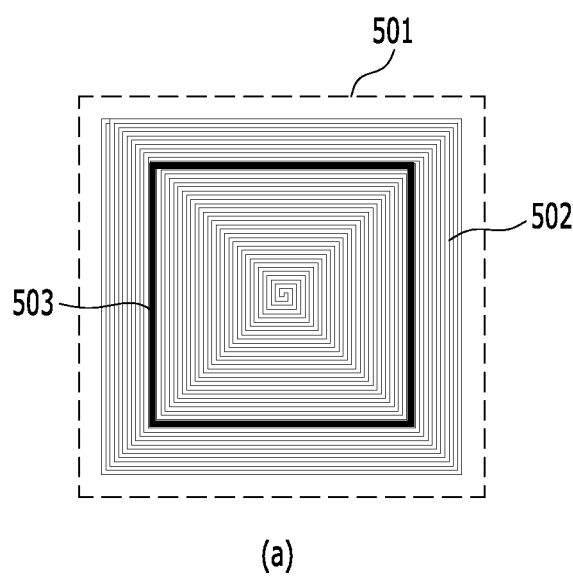
FIGS. 5A to 5C are diagrams illustrating a resonator using magnetic resonance in accordance with another embodiment of the present invention.
Figure 5B:
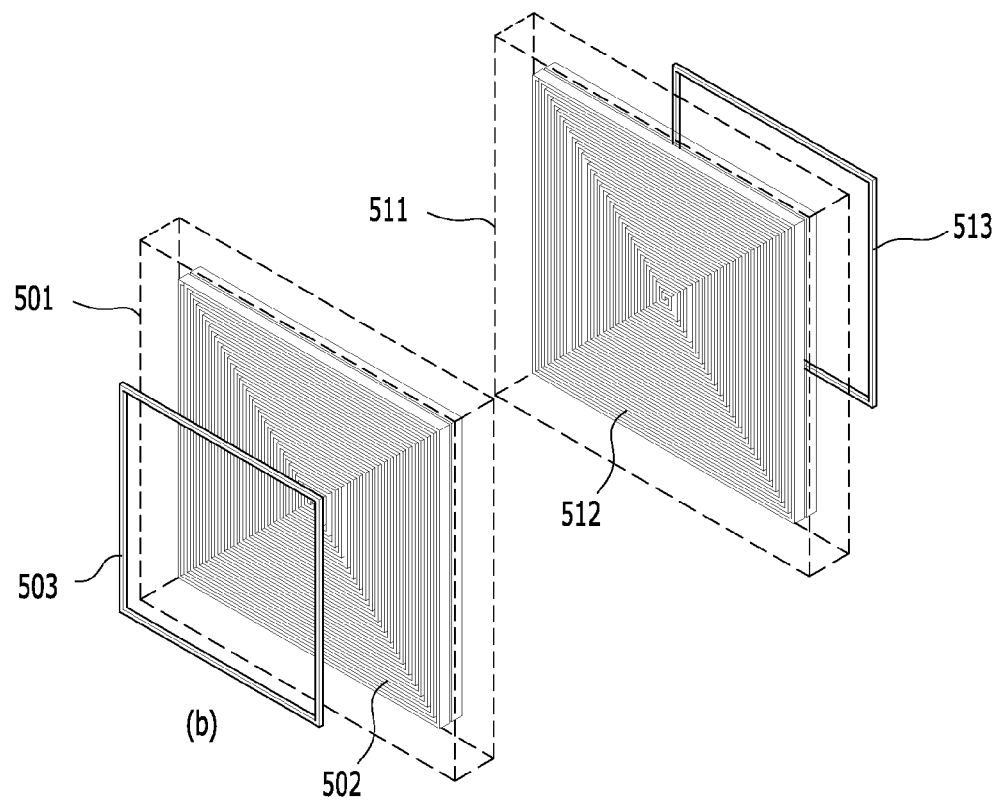
Figure 5C:
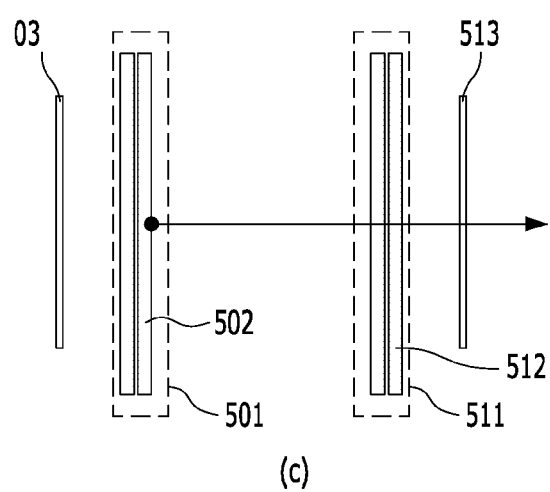

FIGS. 5A to 5C are diagrams illustrating a resonator using magnetic resonance in accordance with another embodiment of the present invention.

FIG. 5A is a top view of a transmission end resonator or a receiving end resonator having a square structure. That is, a reference numeral 502 is a coil having a predetermined width and a thickness, and a reference numeral 503 is a feeding roof. The feeding roof 503 also has a square structure. A reference numeral 501 illustrates a dielectric having a predetermined dielectric constant completely surrounds a resonance coil as an external edge of the transmission end resonator or the receiving end resonator. A dielectric having a dielectric constant $\in_r$ of 10 may be used. A difference between inclusion of dielectric and exclusion of dielectric is in a relation $\sqrt{\in_r}$ of resonant frequency. That is, the dielectric may be inserted or not inserted. That is, the resonator in accordance with an embodiment of the present invention may include the dielectric 501 or may exclude the dielectric 501.

Like the circular resonator according to the above described embodiment of the present invention, a coil forming the transmission end resonator or the receiving end resonator having the square shape has a predetermined line width and a line thickness. Unlike the above described embodiment of the present invention, the resonator of FIG. 5A has a square shape. Accordingly, the resonator may be configured as more than two layers. In this case, the layers may be connected by the same method described above. Unlike the circular resonator, the square shaped resonator does not include an empty space. Such a difference is clearly shown in FIGS. 3A to 3C and FIGS. 4A and 4B.

FIG. 5B is a perspective view of a first resonator and a second resonator for transferring power wirelessly in accordance with an embodiment of the present invention. As shown in FIG. 5B, a transmission end resonator and a receiving end resonator are separated at a predetermined distance for transferring electric power wirelessly. The feeding roof 503 of the transmission end resonator is disposed in an opposite direction from the receiving end resonator. The transmission end resonator includes an external edge for maintaining a square shape thereof and a square resonance coil 502.

The receiving end resonator 512 is disposed to face the transmission end resonator. A receiving roof 153 is disposed at an outer side of the square transmission end resonator 512, which is a side farthest away from the transmission end resonator. Also, the receiving end resonator 512 includes an external edge 511 for maintaining the square shape thereof.

FIG. 5C is a later perspective view of FIG. 5B. That is, FIG. 5C illustrates internal resonance coils 502 and 512. Like reference numerals denote like elements through FIGS. 5B and 5C for convenience. The detail description thereof is omitted herein.

As described above, the square resonators shown in FIGS. 5A to 5C have the same characteristics of the circular resonators having the spiral structure. However, the square spiral structure shown in FIGS. 5A to 5C causes the increment of inductance L more than the circular spiral structure.

Figure 6A:
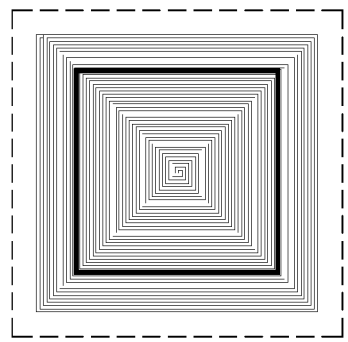
FIGS. 6A to 6C are a three-dimensional view illustrating an electric field shield for blocking an electric field in a wireless energy transfer apparatus in accordance with an embodiment of the present invention.
Figure 6B:
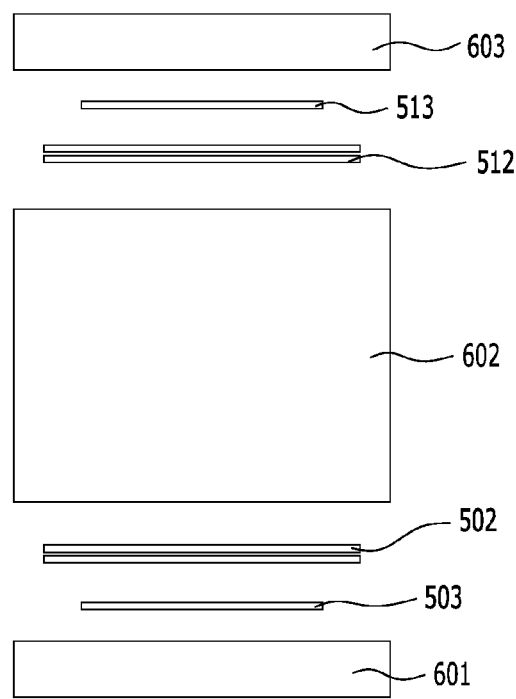
Figure 6C:
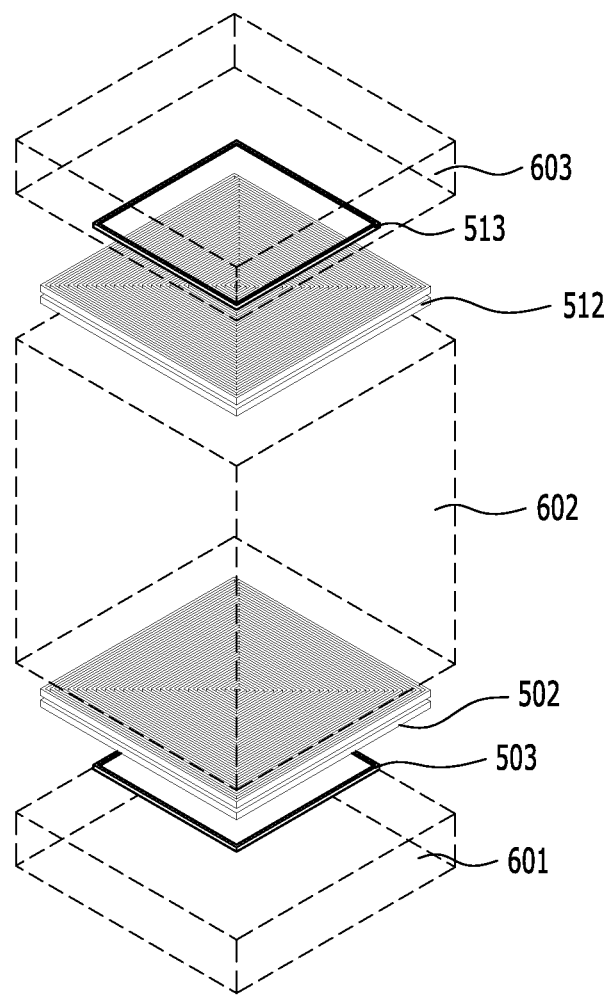

FIGS. 6A to 6C are a three-dimensional view illustrating an electric field shield for blocking an electric field in a wireless energy transfer apparatus in accordance with an embodiment of the present invention.

Like reference numerals denote like elements in FIGS. 5A to 5C and FIGS. 6A to 6C. Accordingly, the descriptions of the same elements are omitted herein.

As shown in FIGS. 6A through 6C, the wireless energy transfer apparatus having a square spiral structure in accordance with an embodiment of the present invention includes square electric field shields at a front side and a rear side. FIG. 6A is a top view illustrating a wireless energy transfer apparatus including electric field shields, FIG. 6B is a side view illustrating the wireless energy transfer apparatus, and FIG. 6C is a perspective view illustrating the wireless energy transfer apparatus.

A reference numeral 601 denotes a transmission end rear shield having a predetermined thickness (height) and larger than a transmission end resonance coil. The wireless power transfer apparatus in accordance with an embodiment of the present invention further includes a middle electric field shield 602 between the transmission end electric field resonance coil 502 and a reception electric field resonance coil 512. The middle electric field shield 602 has the same size of the rear resonance coil and a thickness thinner than a gap between the transmission end resonance coil 502 and the receiving end electric field resonance coil 512. Also, the wireless energy transfer apparatus in accordance with an embodiment of the present invention includes a receiving end rear shield 603 at a rear side of a reception roof 513 of a receiving end. The receiving end rear shield 603 has the same height and size of the transmission end rear electric field shield.

Each one of the shields 601, 602, and 603 may be made of material having a low dielectric constant and be filled with normal water or purified water. Hereinafter, it is considered that the shields are filled with water unless there is a specific description thereof. That is, the shield is filled with water to improve the effect of the shield because water having a comparative low dielectric constant.

The electric field shields and other internal constituent elements are made of material having a comparative low dielectric constant in accordance with an embodiment of the present invention. However, the electric field shields and other internal constituent elements may be made of a material having a comparative low dielectric loss.

Here, the high dielectric loss material denotes a material having a dielectric loss of about 0.42 to about 1.3. For example, a paper has about 0.18 of the dielectric loss, a Neoprene compound (38% GN) has about 0.27 of the dielectric loss, and a Plexiglass has about 0.165 of the dielectric loss. Accordingly, various combinations thereof may be produced. Therefore, it is preferable to use a material having a dielectric loss higher than about 0.1.

As described above, the electric field shields 1101 and 1102 in accordance with an embodiment of the present invention of FIG. 6 are made of a material having a great electric field shield effect such as water. For example, a plastic, a wood, a glass, a ceramic, and a rubber may be used as the material for the electric field shields 1101 and 1102.

In case of energy transfer using magnetic resonance, energy is transferred using magnetic field, not electric field. Therefore, the magnetic field is primarily formed and distributed when the magnetic resonance is generated. However, in case of a radiation power, electric field is also formed. Further, the magnetic resonance phenomenon also generates an electric field. Therefore, it is appropriate to reduce the electric field when it tries to reduce a radiation amount. Here, a method for reducing an electric field in accordance with an embodiment of the present invention will be described.

Such electric field distribution is dominantly related to a dielectric according to an electric wave theory. Accordingly, it is possible to reduce the electric field and lower a radiation amount by increasing the dielectric loss of the dielectric. That is, it is preferable to use a dielectric that shields an electric field and penetrates a magnetic field. Further, it is preferable to use a material having about 0.1 of a dielectric loss.

Hereinafter, the electric field shields in accordance with an embodiment of the present invention will be described based on a simulation result of an electric field induction phenomenon.

FIGS. 7A to 7D are graphs showing results of simulating an antenna radiation gain, a radiation power pattern, an electric field, and a magnetic field of the shields of FIGS. 6A to 6C.

Figure 7A:
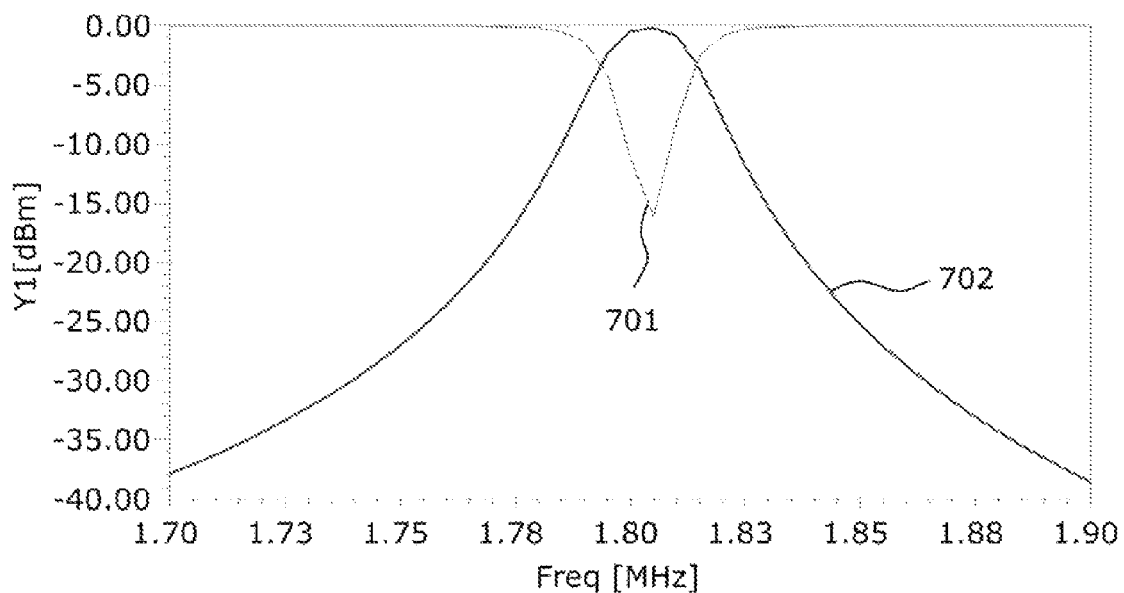
FIGS. 7A to 7D are graphs showing results of simulating an antenna radiation gain, a radiation power pattern, an electric field, and a magnetic field of the shields of FIGS. 6A to 6C.

FIG. 7A is a graph showing a simulation result of an antenna gain as S-parameter in accordance with an embodiment of the present invention. Based on the graph of FIG. 7A, the variation of a resonance frequency in a wireless energy transfer apparatus can be observed. That is, the resonance frequency of the MIT structure is about 10 MHz. The graph shows that such a resonance frequency is lowered to about 1.80 MHz by the structures shown in FIGS. 5A to 5C and FIGS. 6A to 6C.

A reference numeral 701 denotes a graph illustrating a frequency response characteristic simulated as a S-parameter of S1,1 when the electric field is shielded using the shields shown in FIGS. 6A to 6C. A reference numeral 702 denotes a graph illustrating a frequency response characteristic simulated as a S-parameter of S2,1 in the wireless energy transfer apparatus having the structure of FIG. 6.

Here, the graph 701 of s1,1 using the s-parameter is abruptly decreased at about 1.80 MHz. That is, the graph 701 shows the maximum radiation occurs from a transmission end to a receiving end at about 1.80 MHz because resonance is generated at 1.80 MHz.

The S(2,1) using the s-parameter is a value denoting power transfer from a first port to a second port. That is, it is a graph simulating gain when electric power is radiated from a transmission end to a receiving end with an electric field shielded in the wireless energy transfer apparatus shown in FIGS. 6A to 6C.

Figure 7B:
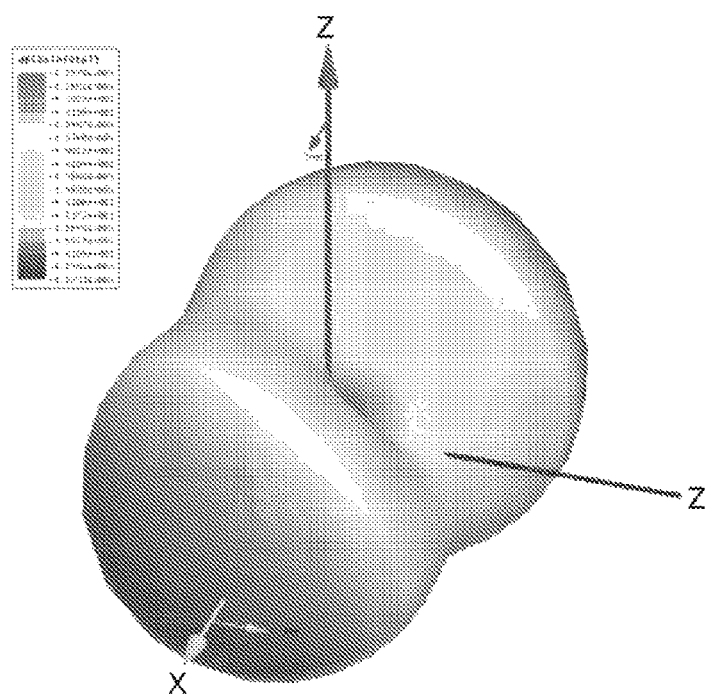

The simulation result of FIG. 7B is a graph illustrating a radiation power and a pattern thereof when an electric field is shielded in the wireless energy transfer apparatus of FIGS. 6A to 6C and FIGS. 5A to 5C. As shown in the simulation result graph of FIG. 7B, the radiation power is significantly smaller than that shown in FIG. 2B when the electric field is shielded in the wireless energy transfer apparatus of FIGS. 6A to 6C.

Figure 7C:
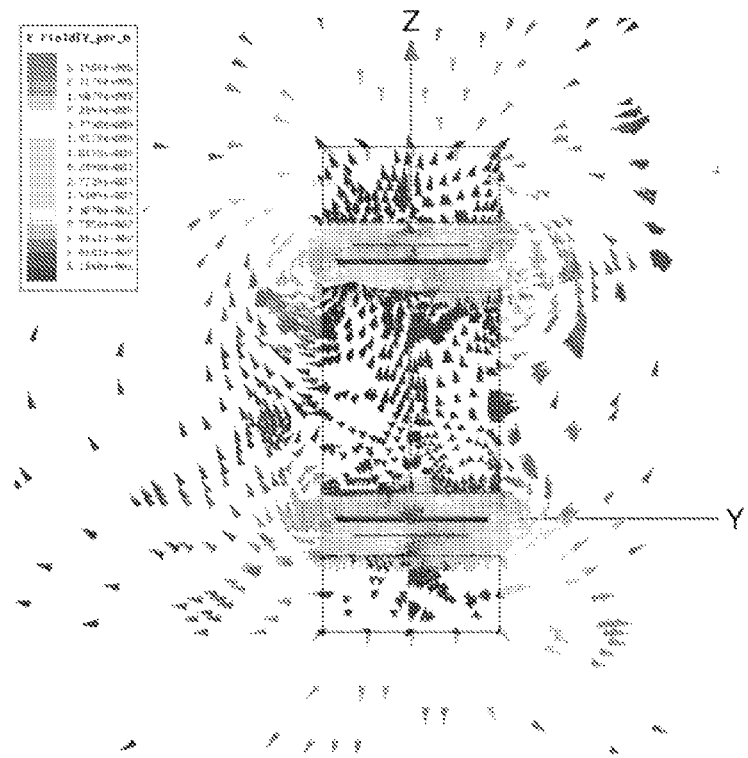

FIG. 7C is a graph illustrating a result of simulating an electric field when an electric field is shielded in a wireless energy transfer apparatus of FIG. 6A to 6C. As shown in FIG. 7C, the radiation of the electric field is significantly decreased when the electric field is blocked using the electric field shields of FIG. 7C.

Figure 7D:
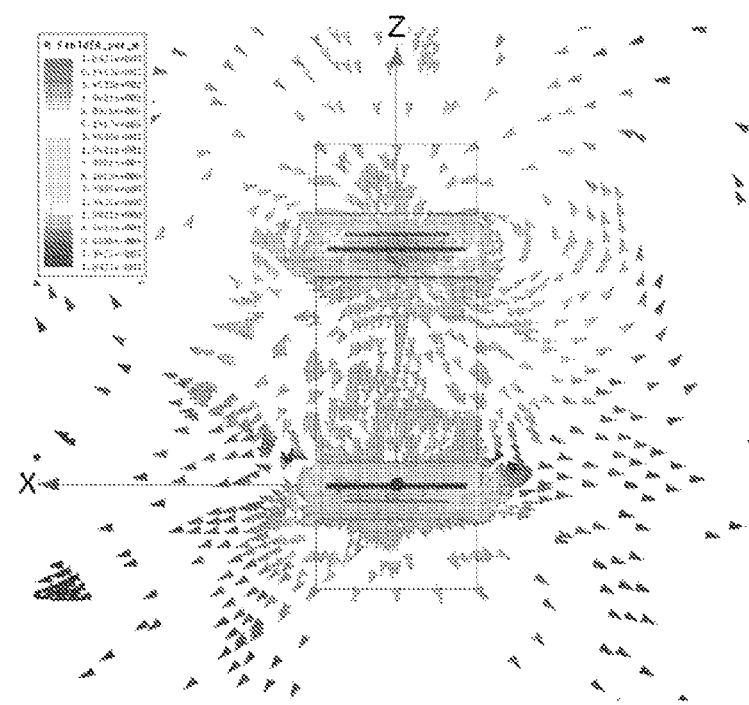

FIG. 7D is a graph illustrating a result of simulating a magnetic field when an electric field is blocked in a wireless energy transfer apparatus of FIGS. 6A to 6C. As shown in FIG. 7D, there is not a notable difference in the radiation of the magnetic field when an electric field is blocked using the electric field shield.

According to the results shown in FIGS. 7A to 7C, it is confirmed that the intensity of the electric field is abruptly reduced and the radiation power is also abruptly decreased without any loss of (S2, 1), which is a result of simulating an energy transfer property with s-parameter when the electric field shield of FIGS. 6A to 6C in accordance with an embodiment of the present invention. That is, an energy transfer mechanism is decided entirely according to the magnetic field in a magnetic resonance structure. Particularly, it suggests that the radiation power can be reduced by causing the reduction of the electric field.

If the radiation power is converted to an antenna gain in the structures of FIGS. 6A to 6C using the results of FIGS. 7A to 7D, it becomes about −42 dBi. That is, only about 0.006 W of electric power is radiated when about 100 W of electric power is transferred. Accordingly, the radiation power can be significantly reduced by employing the electric field shield having water of a low dielectric constant. That is, the electric field shield with water included can significantly reduce the radiation of the electric field. Also, there is almost no energy loss in the energy transfer property S(2,1). For example, the energy transfer property S(2,1) is about −0.198 dB.

FIGS. 8A to 8D are graphs showing results of simulations of an antenna radiation gain, a radiation power pattern, an electric field, and a magnetic field in a helical structure including the resonance unit of FIGS. 6A to 6C with two spiral layers.

Figure 8A:
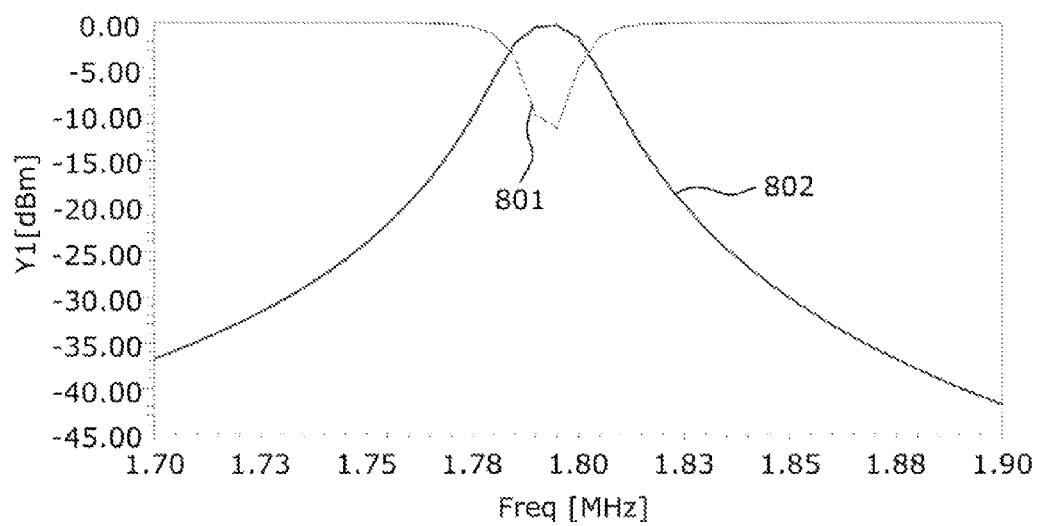
FIGS. 8A to 8D are graphs showing results of simulations of an antenna radiation gain, a radiation power pattern, an electric field, and a magnetic field in a helical structure including the resonance unit of FIGS. 6A to 6C with two spiral layers.

At first, FIG. 8A is a graph showing a result of simulating a radiation gain with S-parameter in an embodiment of the present invention. The graph of FIG. 8A shows the variation of a resonance frequency in a wireless power transfer apparatus in accordance with an embodiment of the present invention. That is, the resonance frequency of the MIT structure was about 10 MHz. Such a resonance frequency is lowered to about 1.7950 MHz by the embodiment of the present invention.

A reference numeral 801 is a graph illustrating a frequency response characteristic simulated as a S-parameter of S1,1. A reference numeral 802 is a graph illustrating a frequency response characteristics simulated as a S-parameter of S2,1.

Here, the graph 801 using the s-parameter of S1,1 shows that the resonance frequency is abruptly decreased at about 1.7950 MHz. As shown, the resonance is occurred at about 1.7950 MHz. That is, the maximum radiation from a transmission end to a receiving end is occurred at about 1.7970 MHz.

Further, the S(2,1) of S-parameter is an analysis value for power transfer from a first port to a second port.

Figure 8B:
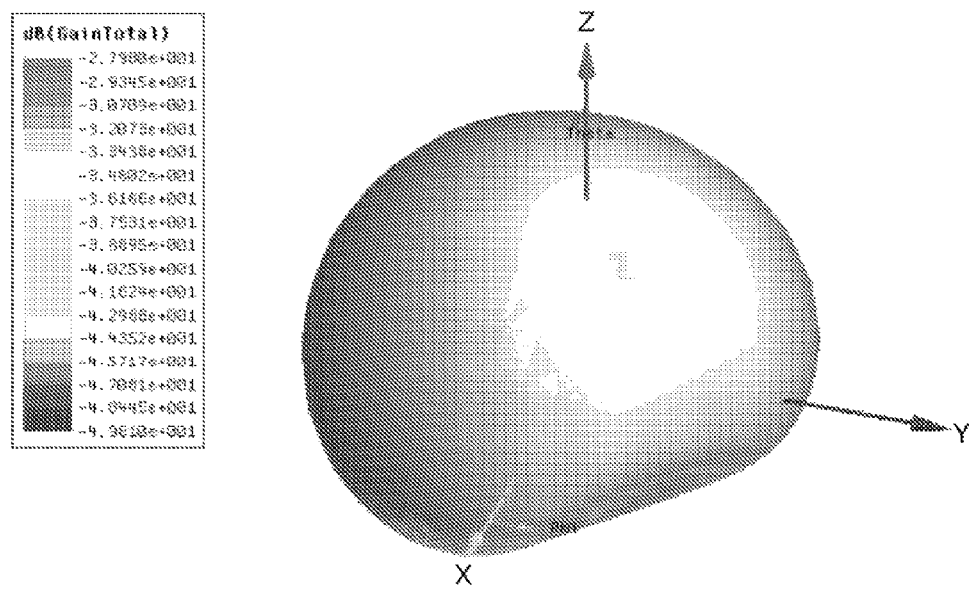

FIG. 8B is a graph illustrating a result of simulating a radiation power and a pattern thereof in a helical structure having only a magnetic resonator and two spiral layers. As shown in the simulation result graph of FIG. 8B, the radiation power is significantly smaller than that shown in FIG. 2A when the electric field is shield.

Figure 8C:
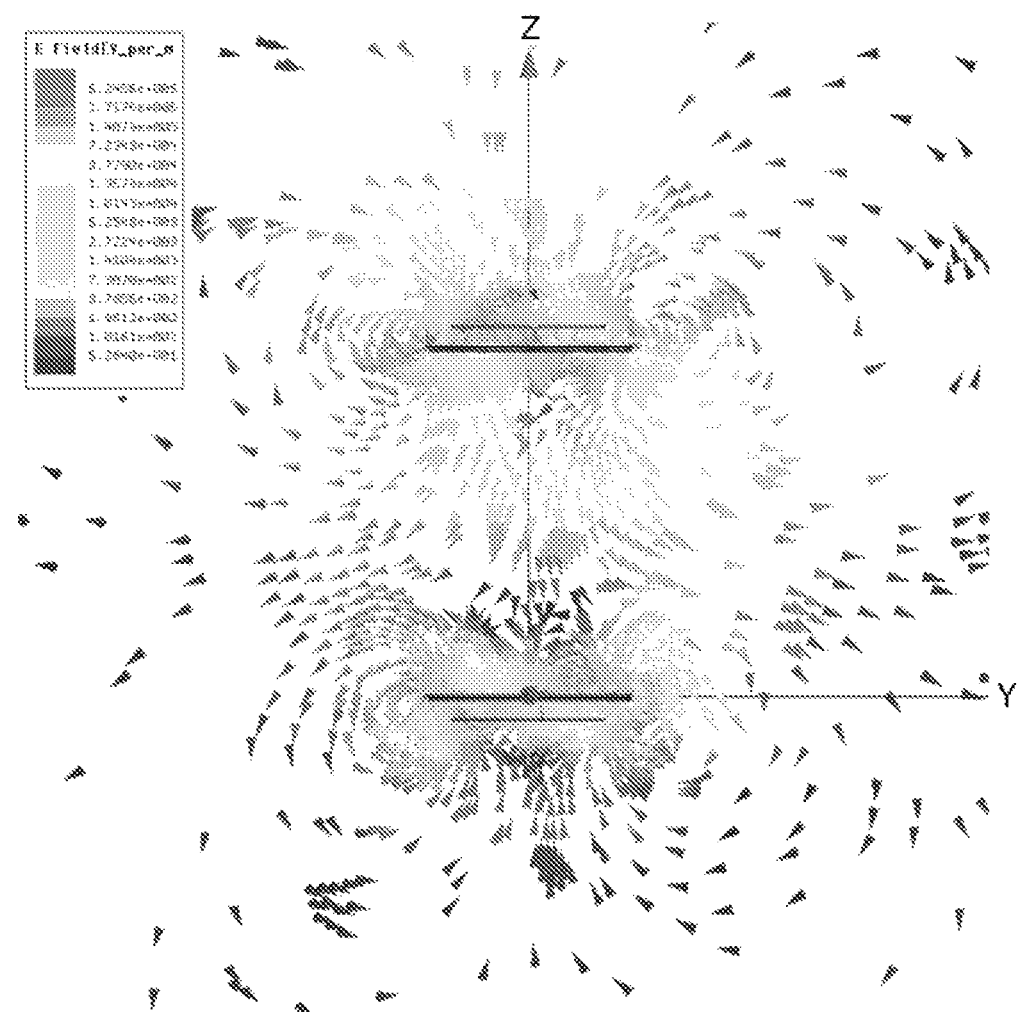

FIG. 8C is a graph illustrating a result of simulating an electric field when the electric field is shielded in a helical structure having only a resonator with two spiral layers in accordance with an embodiment of the present invention. As shown in FIG. 8C, the radiation of the electric field is significantly reduced when the electric field is shielded using the electric field shield in accordance with an embodiment of the present invention.

Figure 8D:
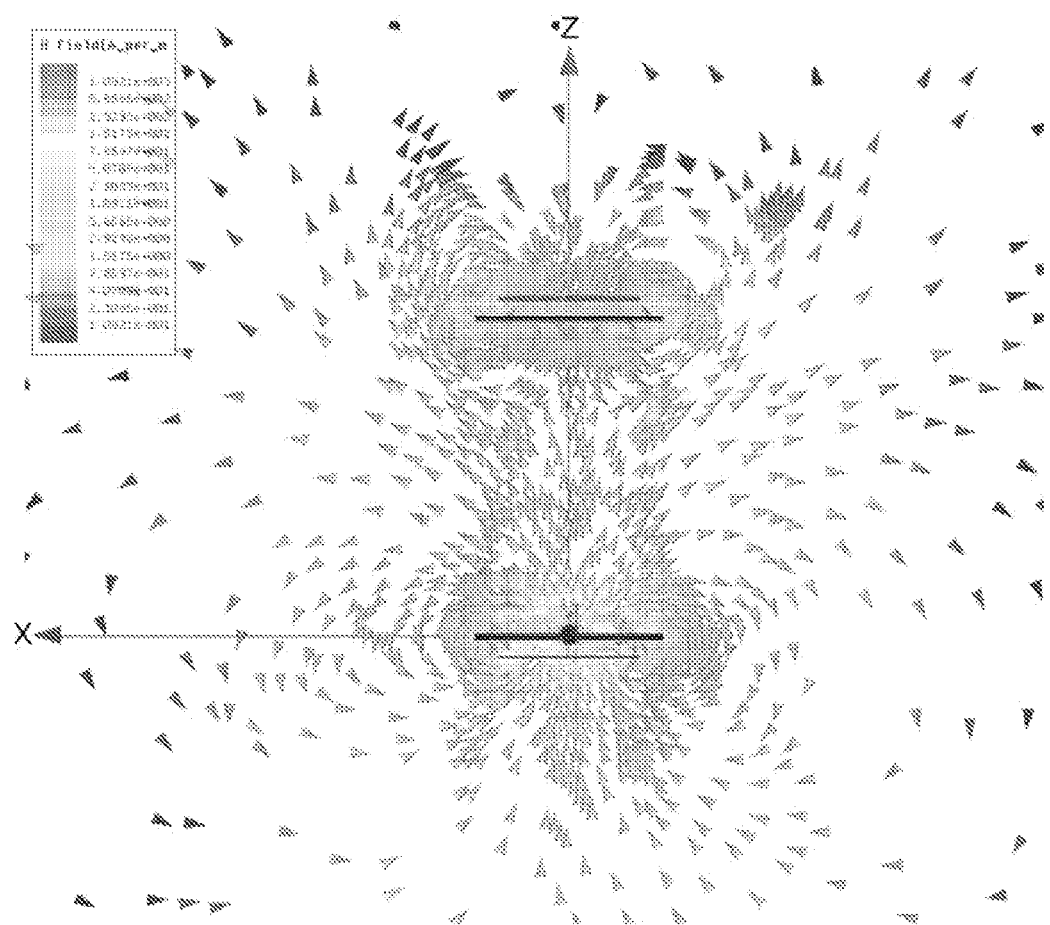

FIG. 8D is a graph illustrating a result of simulating a magnetic field when an electric field is shielded in a helical structure having only a resonator with two spiral layers in accordance with an embodiment of the present invention. As shown in FIG. 8D, there is no notable difference in the radiation of the magnetic field when the electric field is shielded using the electric field shield in accordance with an embodiment of the present invention.

According to the simulation results of FIGS. 8A to 8D, the intensity of the electric field is abruptly decreased and also the radiation power is significantly decreased without the loss of the (S2,1) of S-parameter in case of using the electric field shield in accordance with an embodiment of the present invention.

Figure 9A:
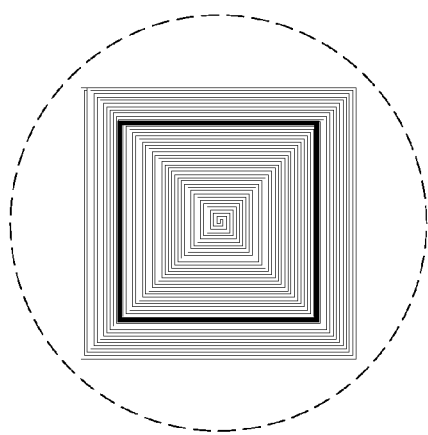
FIGS. 9A to 9C are diagrams illustrating an electric field shield in accordance with another embodiment of the present invention.
Figure 9B:
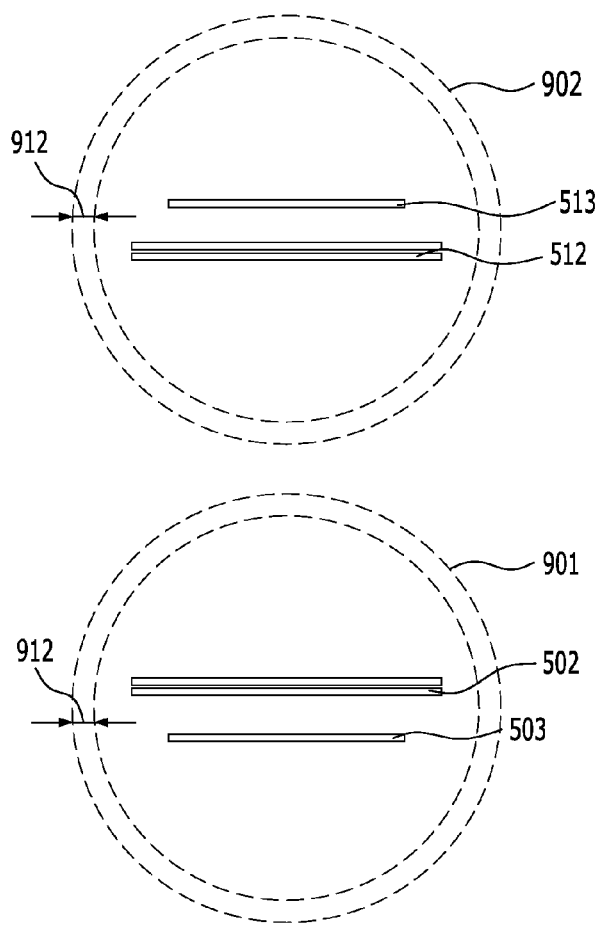
Figure 9C:
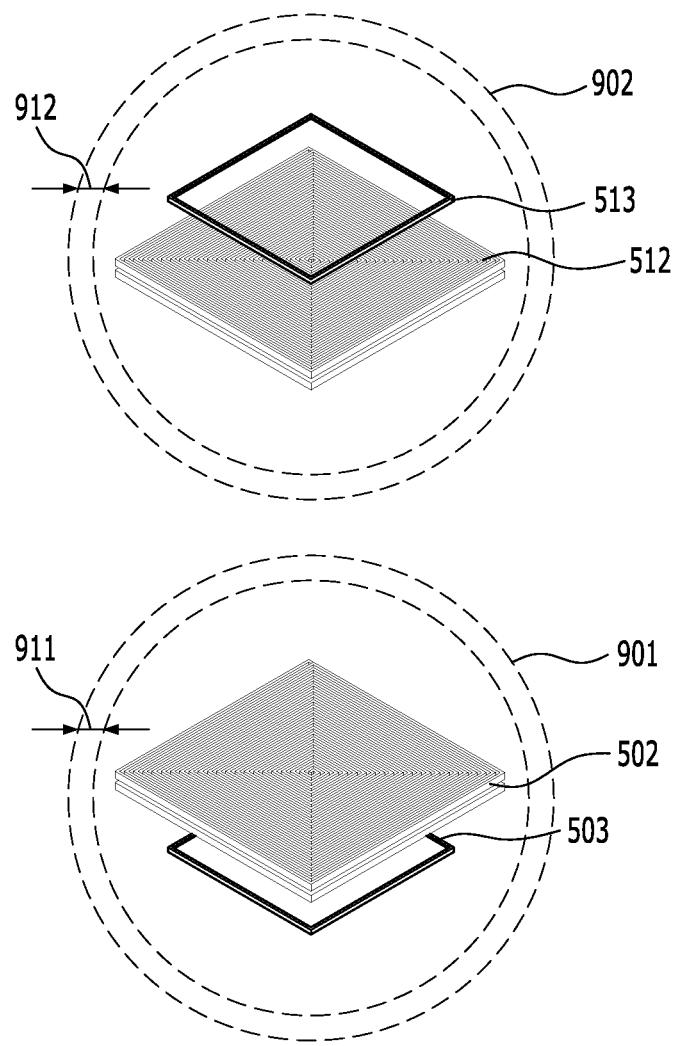

FIGS. 9A to 9C are diagrams illustrating an electric field shield in accordance with another embodiment of the present invention. FIG. 9A is a top view of the electric field shield. FIG. 9B is a later view of the electric field shield. FIG. 9C is a perspective view thereof.

Like reference numerals denote like elements in FIGS. 5A to 5C and FIGS. 9A to 9C. Accordingly, the descriptions of the same elements are omitted herein. In FIGS. 9A to 9C each one of circular electric field shields includes an inner circle shield and an outer circle shield with a different radius. That is, the circular electric field shields 901 and 902 have about a 2 mm difference 911 and 912 in radius between the inner circle shield and the outer circle shield.

Such circular electric field shields 901 and 902 are configured to include the inner circle shield and the outer circle shield with a radius difference and water or other material having a comparative large dielectric loss is inserted in a gap formed by the inner circle shield and the outer circle shield. For convenience, the circular electric field shield in accordance with the embodiment of the present invention is described to be filled with water. However, the present invention is not limited thereto. Any material having a comparative large dielectric loss may be filled with a gap between the internal circle shield 911 and the outer circle shield 912 in the electric field shields 901 and 902. It is preferable to use a material having about 0.1 of dielectric loss in an embodiment of the present invention.

The electric field shields 901 and 902 block an electric field and penetrate a magnetic field. Water is not filled in the internal circular structure of the electric field shields 901 and 902 to present only a magnetic resonator and a feeding roof. Such a structure blocks and reduces the electric field and reduces the radiation.

As shown in FIGS. 9A to 9C, transmission end and receiving end resonators each having a square spiral structure are included in the circular electric field shields in accordance with an embodiment of the present invention.

A reference numeral 901 denotes a transmission end electric field shield including a transmission end resonator 502 and a feeding roof 503. In the electric field shield 901, an electric field induced between the transmission end resonator 502 and the feeding roof 503 is not influenced as described above. The gap between the outer circle shield and the inner circle shield of the electric field shield 901 is filled with normal or purified water. Although water having a comparative high dielectric constant is used in the embodiment of the present invention, other material may be used if the water has a comparative high dielectric loss for the electric field.

A receiving end electric field shield 902 includes a receiving roof 513 and a receiving end resonator 512. In the electric field shield 901, an electric field induced between the receiving end resonator 503 and the receiving roof 513 is not influenced as described above. The gap between the outer circle shield and the inner circle shield of the electric field shield 902 is filled with normal or purified water.

As a raw material of the electric field shields 901 and 902 of FIGS. 9A to 9C, a material having a high electric field shielding effect like water may be used. For example, a material having a high dielectric loss such as plastic, wood, glass, ceramic, or rubber may be used. Such electric field shields 901 and 902 are for blocking electric field induced to the outside thereof. By blocking the electric field radiated to the outside, the influence to human body can be minimized.

Hereinafter, results of simulating an electric field inducing phenomenon in a wireless power transfer apparatus having the electric field shields 901 and 902 will be described.

FIGS. 10A to 10D are graphs showing results of simulating an antenna radiation gain, a radiation power pattern, an electric field, and a magnetic field in the embodiment of the present invention of FIGS. 9A to 9c.

Figure 10A:
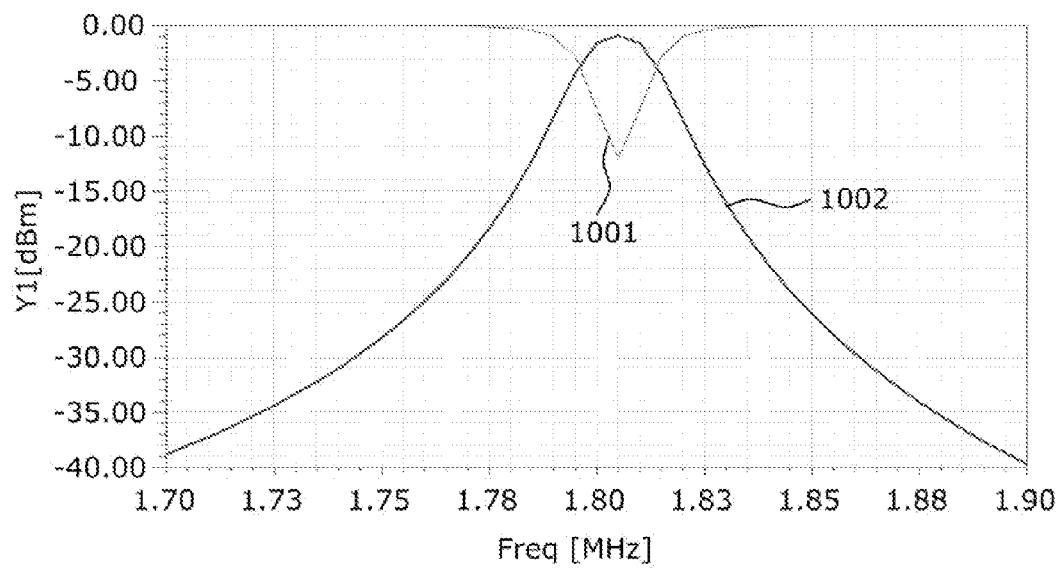
FIGS. 10A to 10D are graphs showing results of simulating an antenna radiation gain, a radiation power pattern, an electric field, and a magnetic field in the embodiment of the present invention of FIGS. 9A to 9c.

FIG. 10A is a graph illustrating a result of simulating a radiation gain with a s-parameter in an embodiment of the present invention. The graph of FIG. 10A shows that the resonance frequency of the wireless energy transfer apparatus is about 1.8050 MHz.

A reference numeral 1001 is a graph showing a frequency response characteristic simulated with a S-parameter of S1,1 when an electric field is blocked by the shields of FIGS. 9A to 9C. A reference numeral 1002 is a graph illustrating a frequency response characteristic of S2, 1 in a wireless power transfer apparatus having the shields of FIGS. 9a to 9C. Here, the graph 1001 shows that a resonance frequency is significantly decreased at about 1.8050 MHz. As shown, the resonance is occurred at 1.8050 MHz and maximum radiation is occurred from a transmission end to a receiving end thereby.

The S(2,1) of s-parameter is an analysis value for power transfer when power is transferred from a first port to a second port. That is, FIG. 10A is a graph illustrating a simulation result of a gain in the wireless power transfer apparatus having the shields of FIGS. 9A to 9C when the power is transferred from the transmission end to the receiving end.

Figure 10B:
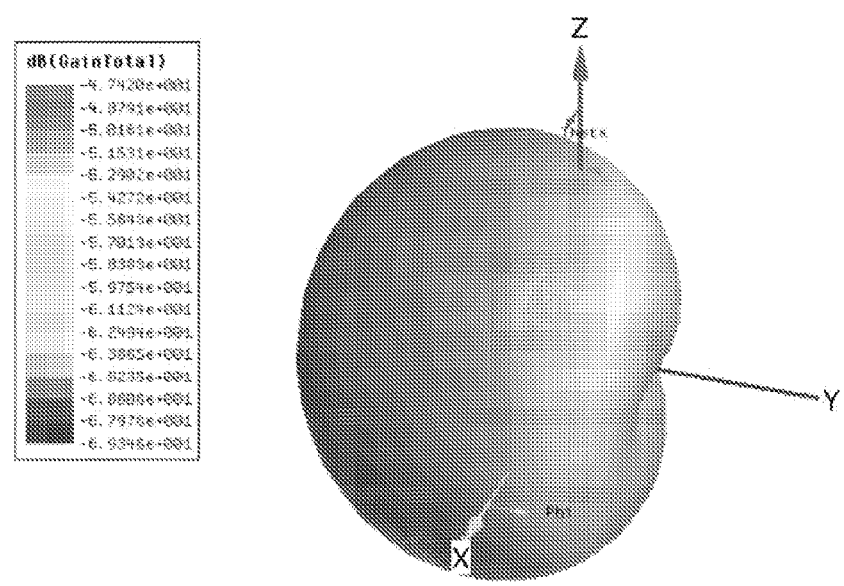

FIG. 10B is a graph showing a result of simulating a radiation power and a pattern thereof when an electric field is shielded in a wireless power transfer apparatus including the shields shown FIGS. 9A to 9C. As shown in the simulation result graph of FIG. 10B, the radiation power is very smaller than that shown in FIG. 2A when the electric field is shielded in the wireless power transfer apparatus having the shields of FIGS. 9A to 9C.

Figure 10C:
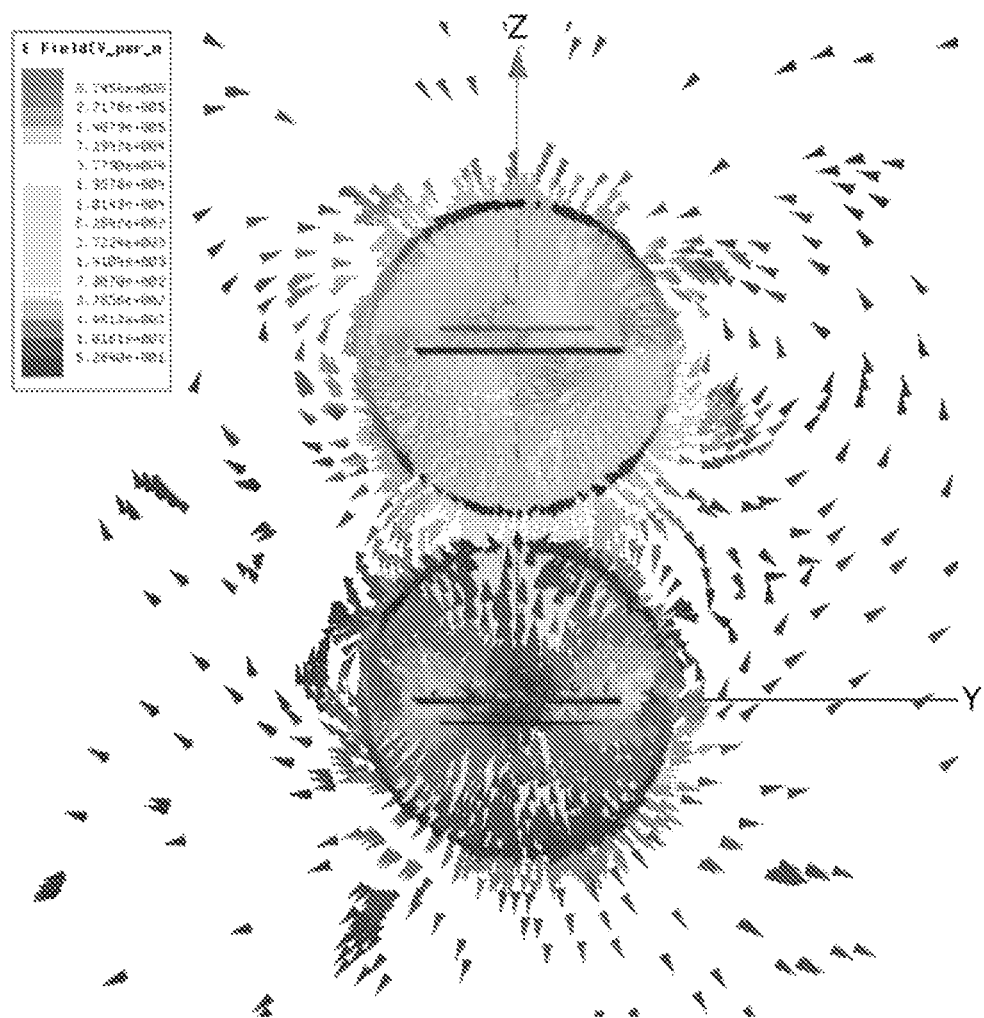

FIG. 10C is a graph illustrating a result of simulating an electric field when the electric field is shielded in a wireless power transfer apparatus including the shields shown in FIGS. 9A to 9C. As shown in FIG. 10C, the radiation of electric field is significantly decreased when the electric field is blocked using the electric field shields of FIGS. 9A to 9C.

Figure 10D:
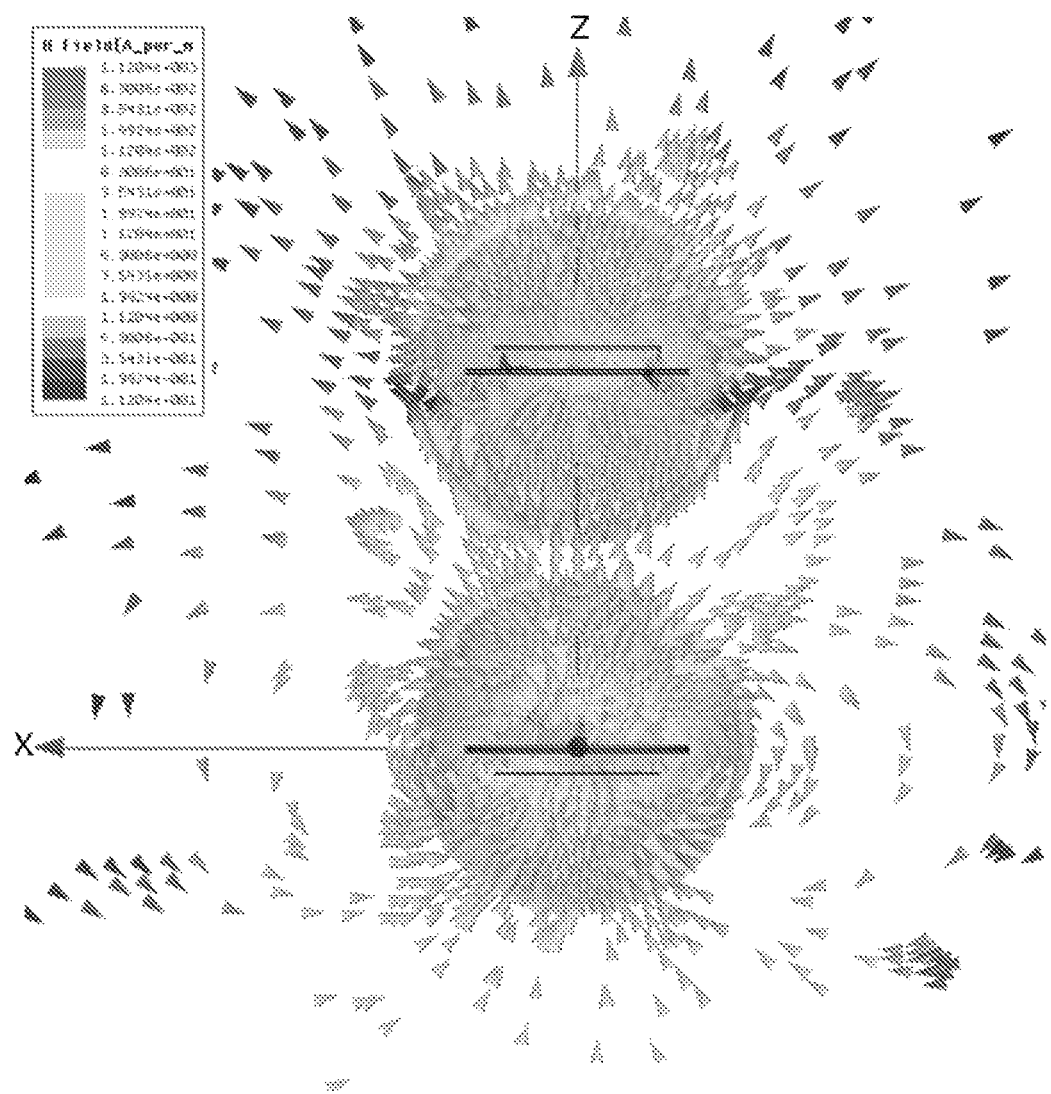

FIG. 10D is a graph illustrating a result of simulating a magnetic field when an electric field is blocked using a wireless power transfer apparatus having shields of FIGS. 9A to 9C. As shown in FIG. 10D, there is no notable change in the radiation of the magnetic fields when the electric field is shield using the electric field shields of FIGS. 9A to 9C.

According to the simulation results shown in FIGS. 10A to 10D, the intensity of the electric field is abruptly decreased and the radiation power is also significantly reduced without loss of the energy transfer characteristic (S2,1) using the electric field shields of FIGS. 9A to 9C. That is, an energy transfer mechanism is decided entirely according to the magnetic field in a magnetic resonance structure. Particularly, it suggests that the radiation power can be reduced by causing the reduction of the electric field.

If the radiation power is converted to an antenna gain in the structures of FIGS. 9A to 9C using the results of FIGS. 10A to 10D, it becomes about −47 dBi. That is, only about 0.002 W of electric power is radiated when about 100 W of electric power is transferred. Accordingly, the radiation power can be significantly reduced by employing the electric field shield having water of a low dielectric constant. That is, the electric field shield with water included can significantly reduce the radiation of the electric field.

Figure 11A:
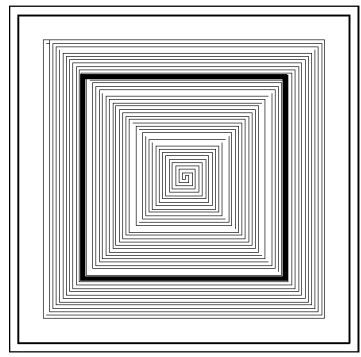
FIGS. 11A to 11C are diagrams showing an electric field shield in accordance with still another embodiment of the present invention.
Figure 11B:
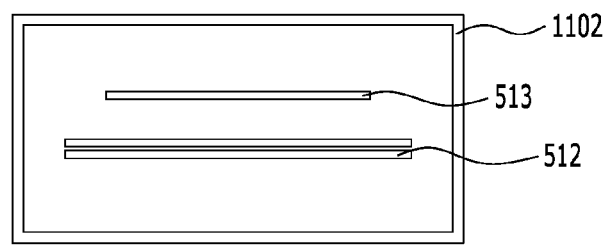
Figure 11B:
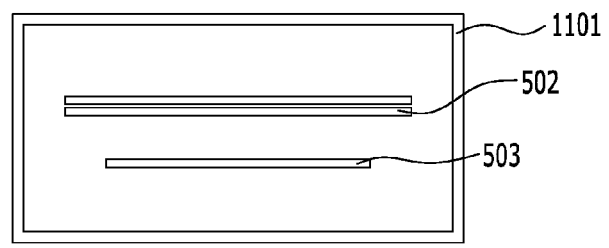
Figure 11C:
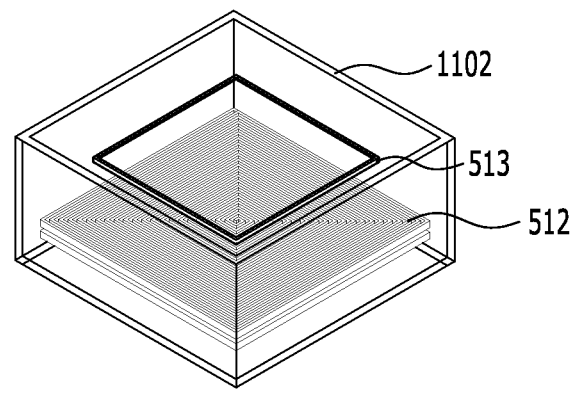
Figure 11C:
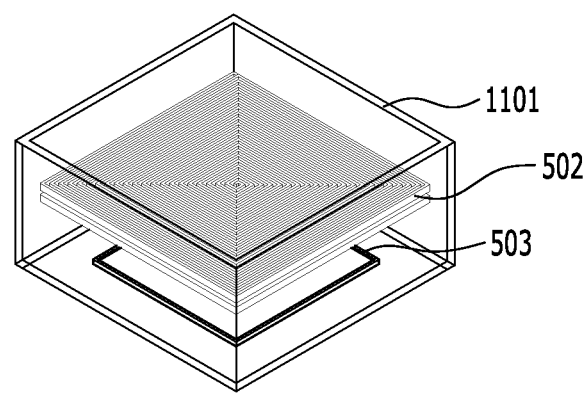

FIGS. 11A to 11C are diagrams showing an electric field shield in accordance with still another embodiment of the present invention.

Like reference numerals denote like elements in FIGS. 5A to 5C and FIGS. 11A to 11C. The detailed descriptions of the same elements are omitted herein.

As shown in FIGS. 11A to 11C, transmission end and receiving end square electric field shields 1101 and 1102 include a wireless energy transfer apparatus having a square spiral structure. Further, each one of the transmission end and receiving end square electric field shields 1101 and 1102 includes an inner hexahedron shield and an outer hexahedron shield with a predetermined gap. Such a gap may be about 2 mm or smaller or larger than 2 mm. A proper size of the gap may be determined through simulations. In the present embodiment, the gap is about 2 mm. As described above, the gap is filled with normal water or purified water. Beside the water, any material having high dielectric loss can be used.

Such a structure, as described above, blocks the electric field and penetrates the magnetic field. Accordingly, electric power is transferred but human body is protected from the electric field. Further, the magnetic field influencing other equipment is blocked.

A reference numeral 1101 denotes a square transmission end electric field shield including a transmission end resonator 502 and a feeding roof 503. The gap between the inner hexahedron shield and the outer hexahedron shield is filled with normal or purified water within a range not influencing an electric field induced between the transmission end resonator 502 and the feeding roof 503. Although water having a comparative low dielectric constant is used in the embodiment, other material having a low dielectric constant for the electric field can be used.

In the receiving end, the square receiving end electric field shield 1102 includes the receiving roof 513 and the receiving end resonator 512. The gap between the inner hexahedron shield and the outer hexahedron shield is filled with normal or purified water within a range not influencing an electric field induced between the receiving end resonator 512 and the receiving roof 513.

As a raw material of the electric field shields 1101 and 1102 of FIGS. 11A to 11C, a material having a high electric field shielding effect like water may be used. For example, a material having a high dielectric loss such as plastic, wood, glass, ceramic, or rubber may be used. Such electric field shields 1101 and 1102 are for blocking electric field induced to the outside thereof. By blocking the electric field radiated to the outside, the influence to human body can be minimized.

Hereinafter, results of simulating an electric field inducing phenomenon in a wireless power transfer apparatus having the electric field shields 1101 and 1102 will be described.

FIGS. 12A to 12D are graphs showing results of simulating an antenna radiation gain, a radiation power pattern, an electric field, and a magnetic field in the embodiment of the present invention of FIGS. 11A to 11c.

Figure 12A:
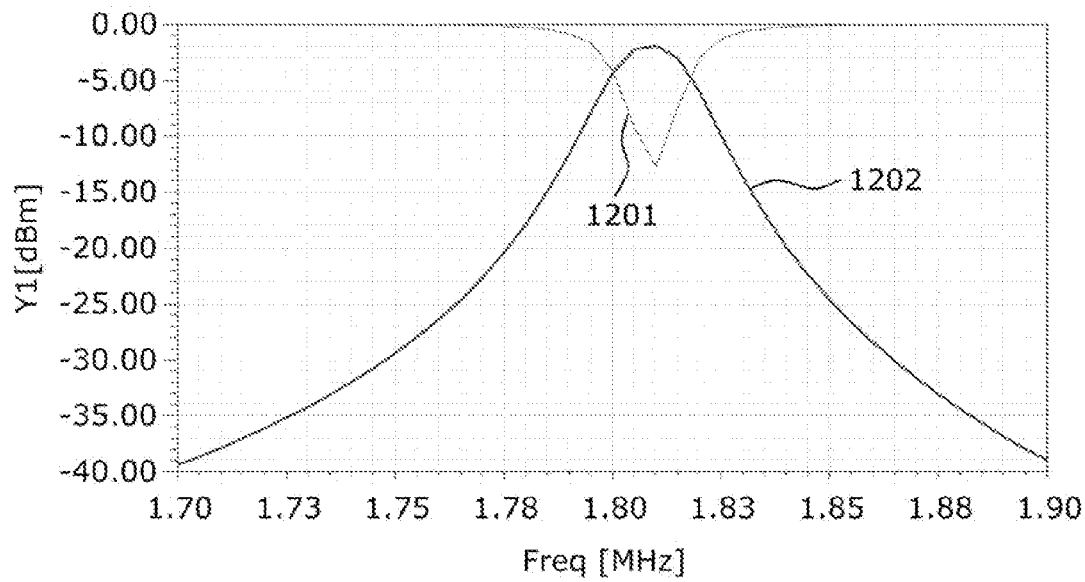
FIGS. 12A to 12D are graphs showing results of simulating an antenna radiation gain, a radiation power pattern, an electric field, and a magnetic field in the embodiment of the present invention of FIGS. 11A to 11c.

FIG. 12A is a graph illustrating a result of simulating a radiation gain with a s-parameter in an embodiment of the present invention of FIGS. 11A to 11C. The graph of FIG. 12A shows that the resonance frequency of the wireless energy transfer apparatus is about 1.81000 MHz.

A reference numeral 1201 is a graph showing a frequency response characteristic simulated with a S-parameter of S1,1 when an electric field is blocked by the shields of FIGS. 11A to 11C. A reference numeral 1202 is a graph illustrating a frequency response characteristic of S2, 1 in a wireless power transfer apparatus having the shields of FIGS. 11a to 11C. Here, the graph 1202 shows that a resonance frequency is significantly decreased at about 1.81000 MHz. As shown, the resonance is occurred at 1.81000 MHz and maximum radiation is occurred from a transmission end to a receiving end thereby.

The S(2,1) of s-parameter is an analysis value for power transfer when power is transferred from a first port to a second port. That is, FIG. 12A is a graph illustrating a simulation result of a gain in the wireless power transfer apparatus having the shields of FIGS. 11A to 11C when the power is transferred from the transmission end to the receiving end.

Figure 12B:
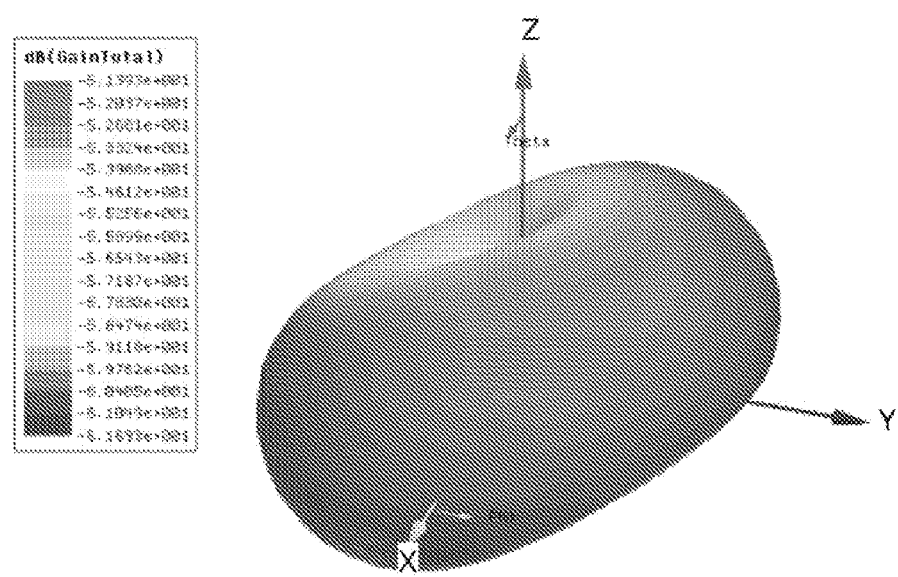

FIG. 12B is a graph showing a result of simulating a radiation power and a pattern thereof when an electric field is shielded in a wireless power transfer apparatus including the shields shown FIGS. 11A to 11C. As shown in the simulation result graph of FIG. 12B, the radiation power is very smaller than that shown in FIG. 2A when the electric field is shielded in the wireless power transfer apparatus having the shields of FIGS. 11A to 11C.

Figure 12C:
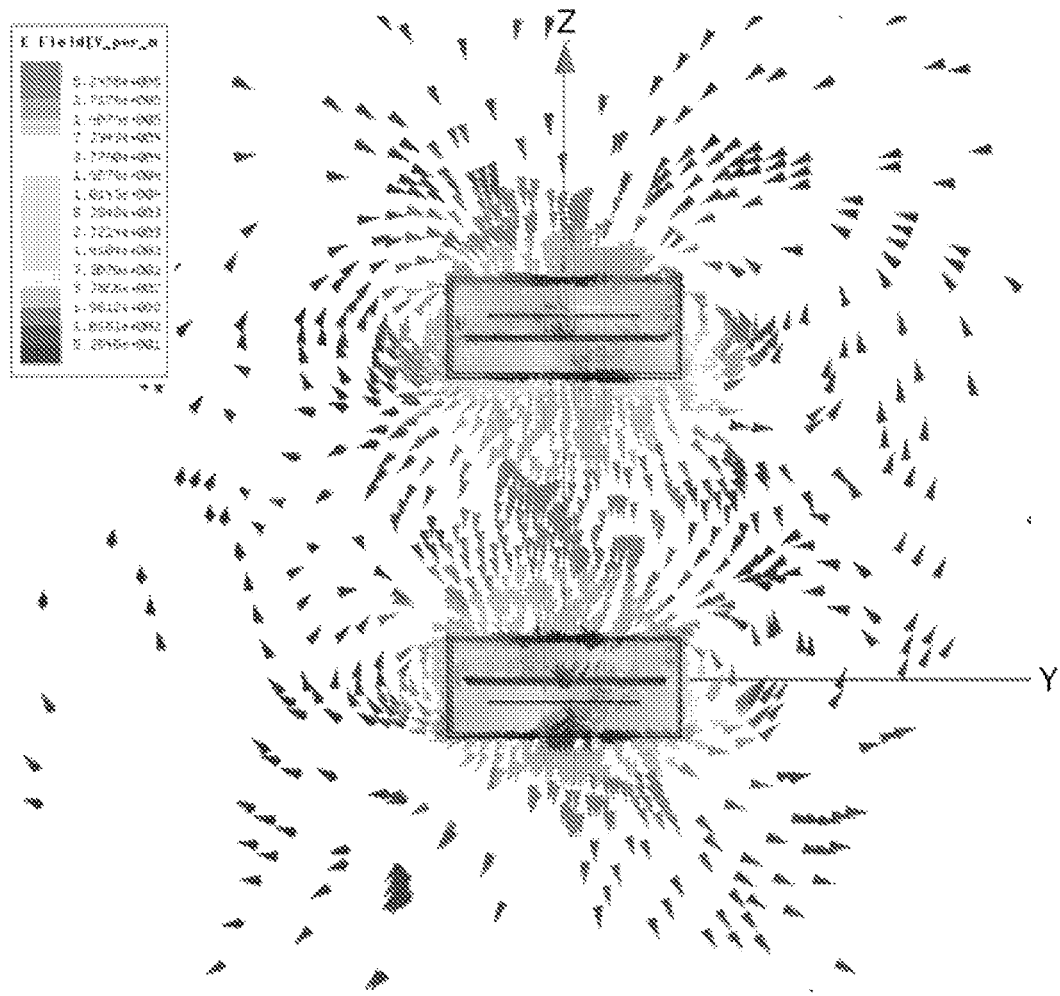

FIG. 12C is a graph illustrating a result of simulating an electric field when the electric field is shielded in a wireless power transfer apparatus including the shields shown in FIGS. 11A to 11C. As shown in FIG. 12C, the radiation of electric field is significantly decreased when the electric field is blocked using the electric field shields of FIGS. 11A to 11C.

Figure 12D:
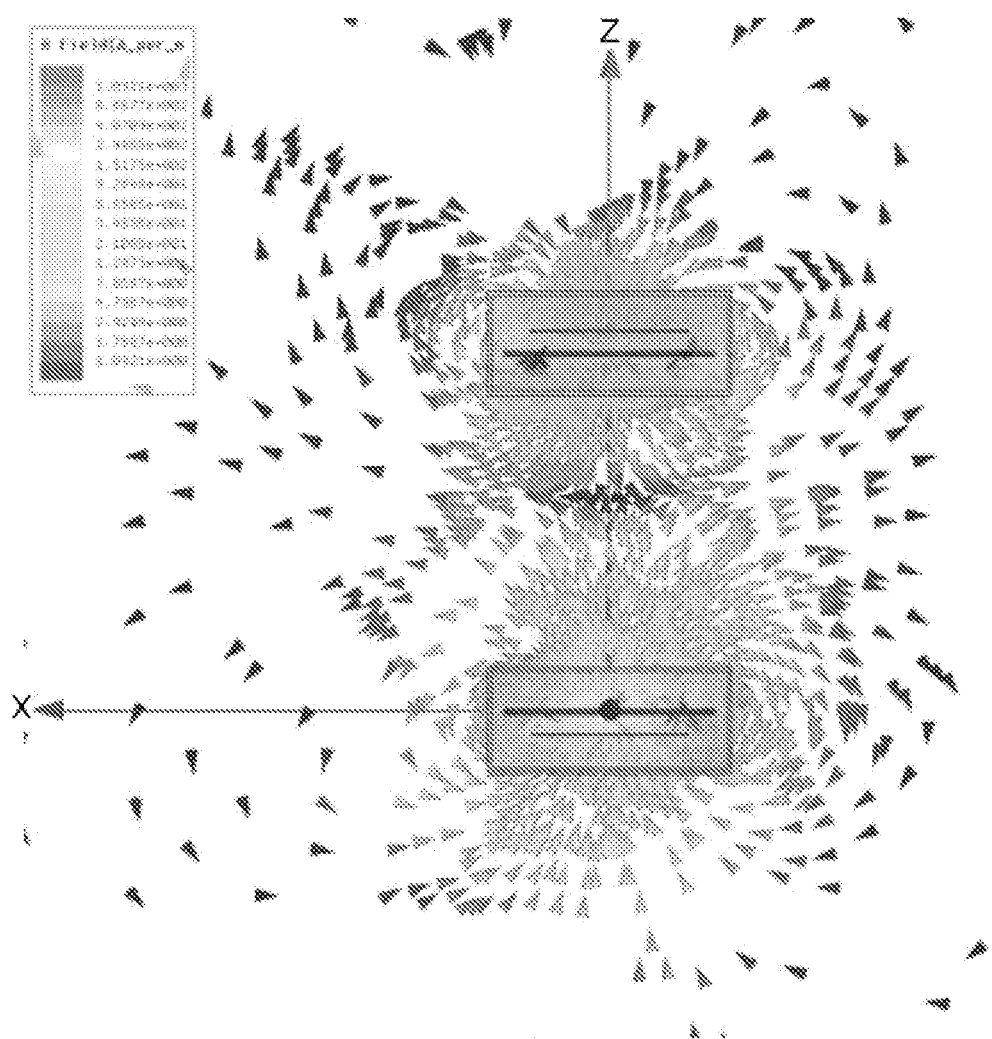

FIG. 12D is a graph illustrating a result of simulating a magnetic field when an electric field is blocked using a wireless power transfer apparatus having shields of FIGS. 11A to 11C. As shown in FIG. 12D, there is no notable change in the radiation of the magnetic fields when the electric field is shield using the electric field shields of FIGS. 11A to 11C.

According to the simulation results shown in FIGS. 12A to 12D, the intensity of the electric field is abruptly decreased and the radiation power is also significantly reduced without loss of the energy transfer characteristic (S2,1) using the electric field shields of FIGS. 11A to 11C. That is, an energy transfer mechanism is decided entirely according to the magnetic field in a magnetic resonance structure. Particularly, it suggests that the radiation power can be reduced by causing the reduction of the electric field.

Figure 13A:
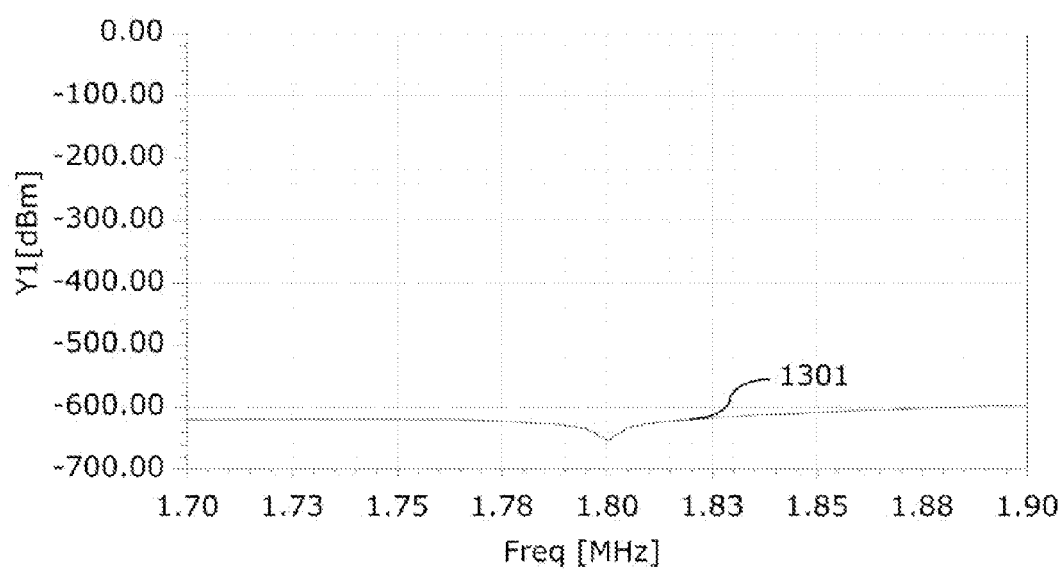
FIGS. 13A to 13C are graphs illustrating results of simulating an antenna radiation gain, an electric field, and a magnetic field when the hexahedron shields are made of metal.
Figure 13B:
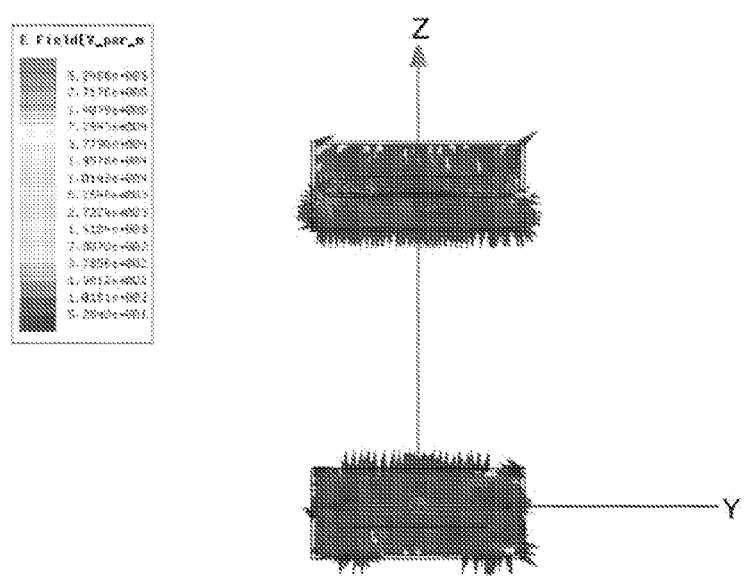
Figure 13C:
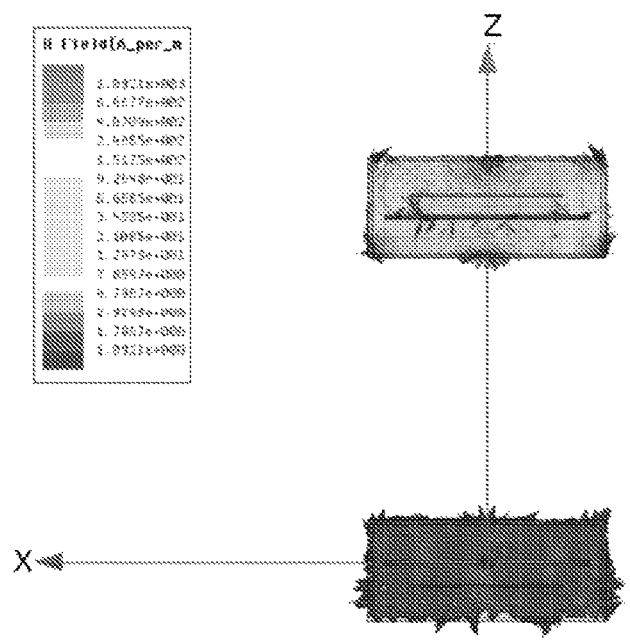

FIGS. 13A to 13C are graphs illustrating results of simulating an antenna radiation gain, an electric field, and a magnetic field when the hexahedron shields are made of metal.

In case of FIGS. 13A to 13C, the gap between the inner and outer hexahedron shields may be filled with a dielectric or not. Although the electric field shield is made of metal with the gap filled with dielectric material in the embodiment of the present invention, the same effect is provided.

Referring to FIG. 13A, a graph 1301 of s1,1 of a S-parameter denoting a resonance frequency shows that a resonance frequency is about 1.805 MHz as described above. However, there is almost no gain value. A graph 1302 of s2,1 of s-parameter shows an analysis value for power transfer from a first port to a second port. The graph 1302 shows that power is not transferred at all. Accordingly, when the metal is used for shielding the electric field, power transfer cannot be achieved.

FIG. 13B is a graph illustrating a result of simulating an electric field the hexahedron shields are made of metal. As shown, the electric field cannot pass the metal shields. Accordingly, wireless power transfer cannot be performed.

FIG. 13C is a graph illustrating a result of simulating a magnetic field when the hexahedron shields are made of metal. As described above, the magnetic field cannot pass through the metal shields. Accordingly, the shields cannot be made of metal.

FIGS. 14A to 14D are graphs showing results of simulating an antenna radiation gain, a radiation power pattern, an electric field, and a magnetic field when a gap between the inner and outer shields of FIGS. 11A to 11B is filled with other material.

Figure 14A:
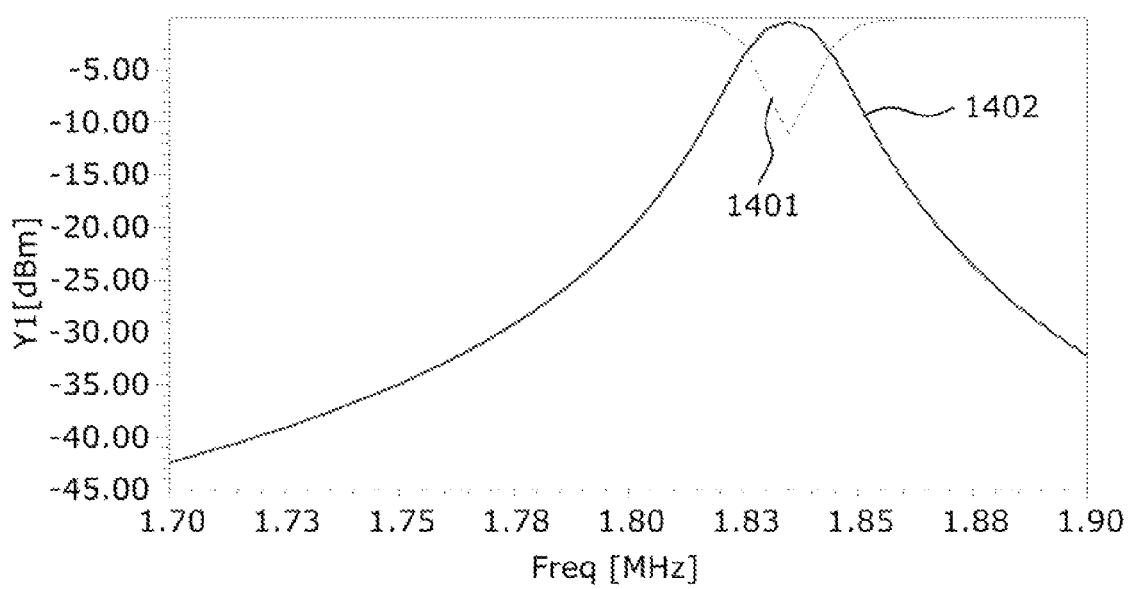
FIGS. 14A to 14D are graphs showing results of simulating an antenna radiation gain, a radiation power pattern, an electric field, and a magnetic field when a gap between the inner and outer shields of FIGS. 11A to 11B is filled with other material.
Figure 14B:
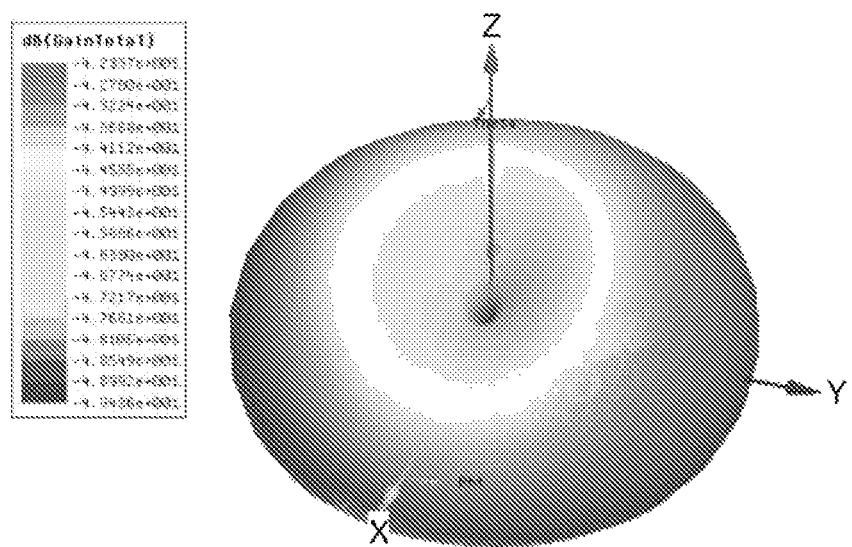

At first, conditions of a dielectric used in simulations of FIGS. 14A to 14B are described.
<Condition>
1. A dielectric constant of a dielectric is about 5.
2. The dielectric has a high loss tan value, for example about 0.1.
3. It is a virtual dielectric, not a real material having the above values.
4. It is assumed that such a material is included in the square electric field shield of FIGS. 11A to 11C.

The electric field shield in accordance with an embodiment of the present invention may have a circular shape and a square shape. FIGS. 9A to 9C illustrate the circular electric field shield and FIGS. 11A to 11c show the square electric field shield. Further, water is used as a dielectric. A material having a comparative high dielectric loss is used as a raw material for the square structure of FIGS. 14A to 14D.

As described above, the dielectric having the comparative high dielectric loss is inserted in the shields for blocking the electric field and penetrating the magnetic field. It is preferable that a dielectric having a dielectric loss about higher than 0.1 is used in an embodiment of the present invention. The same effects may be obtained in the square structure as described above. In case of the dielectric having the high dielectric loss, the circular shields have the same effect.

FIG. 14A is a graph showing a result of simulating a radiation gain with S-parameter according to the above condition. The graph of FIG. 14A shows that a resonance frequency of a wireless power transfer apparatus is about a band of 1.8350 MHz.

A reference numeral 1401 is a graph showing a frequency response characteristic simulated with a S-parameter of S1,1 when an electric field is blocked by the shields of FIG. 9 with a dielectric having the above conditions. A reference numeral 1402 is a graph illustrating a frequency response characteristic of S2, 1 in a wireless power transfer apparatus having the shields of FIG. 9. Here, the graph 1402 shows that a resonance frequency is significantly decreased at about 1.8350 MHz. As shown, the resonance is occurred at 1.8350 MHz and maximum radiation is occurred from a transmission end to a receiving end thereby.

The S(2,1) of s-parameter is an analysis value for power transfer when power is transferred from a first port to a second port. That is, FIG. 14A is a graph illustrating a simulation result of a gain in the wireless power transfer apparatus having the shields of FIGS. 9A to 9C when the power is transferred from the transmission end to the receiving end with the electric field shield filled with a material having the above described conditions.

FIG. 14B is a graph showing a result of simulating a radiation power and a pattern thereof when an electric field is shielded in a wireless power transfer apparatus including the shields shown FIGS. 9A to 9C with a material having the above described condition. As shown in the simulation result graph of FIG. 14B, the radiation power is very smaller than that shown in FIG. 2A when the electric field is shielded in the wireless power transfer apparatus having the shields of FIGS. 9A to 9C and the electric field shield is filled with the material having the above condition.

Figure 14C:
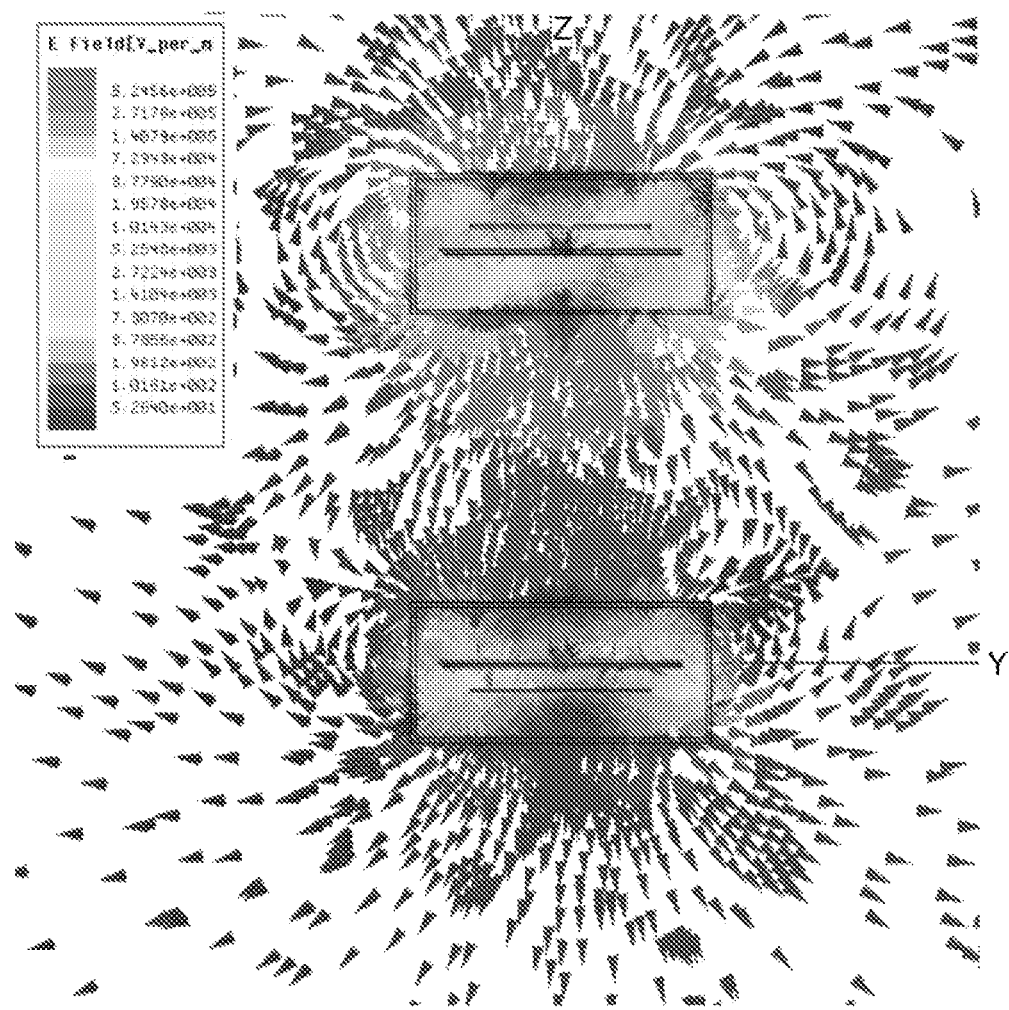

FIG. 14C is a graph illustrating a result of simulating an electric field when the electric field is shielded in a wireless power transfer apparatus including the shields shown in FIGS. 9A to 9C with a material having the above described condition used to fill the shields. As shown in FIG. 14C, the radiation of electric field is significantly decreased when the electric field is blocked using the electric field shields.

Figure 14D:
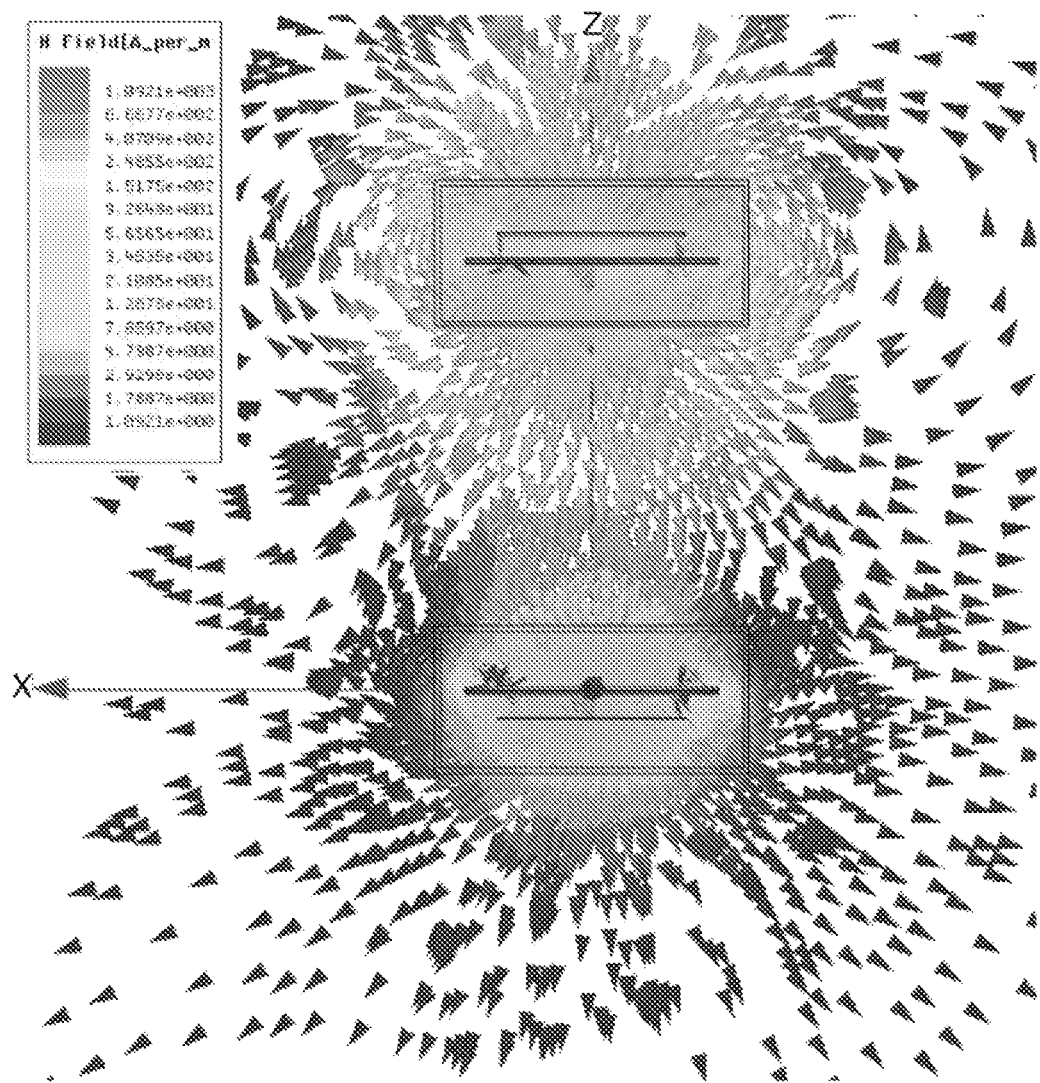

FIG. 14D is a graph illustrating a result of simulating a magnetic field when an electric field is blocked using a wireless power transfer apparatus having shields of FIGS. 11A to 11C with a material having the above conditions used to fill the shields. As shown in FIG. 14D, there is no notable change in the radiation of the magnetic fields when the electric field is shield using the electric field shields.

According to the simulation results shown in FIGS. 14A to 14D, the intensity of the electric field is abruptly decreased and the radiation power is also significantly reduced without loss of the energy transfer characteristic S(2,1) using the electric field shields of FIGS. 11A to 11C filled with the material having the above conditions. That is, an energy transfer mechanism is decided entirely according to the magnetic field in a magnetic resonance structure. Particularly, it suggests that the radiation power can be reduced by causing the reduction of the electric field.

Here, the radiation gain is about −42 dBi. That is, when 100 W is transferred, a radiation power is about 0.006 W which can be ignored. It means that the same characteristics are provided when the dielectric loss value is high although the dielectric constant is slow. Water is only an example. Other material having a comparative high dielectric constant and a comparative high dielectric loss may be used.

Using a material having a comparative high dielectric loss, an electric field can be blocked and a magnetic field can be penetrated. Accordingly, electric power can be transferred while blocking the electric field. In the embodiments of the present invention, materials having a high dielectric loss are used although a dielectric constant thereof is low. Further, the dielectric loss value of the material may be greater than about 0.1. Accordingly, it is very important to use a material having a comparative high dielectric loss in order to reduce the electric field. On the contrary, it is confirmed that there is no effect provided when the dielectric loss is small.

Figure 15A:
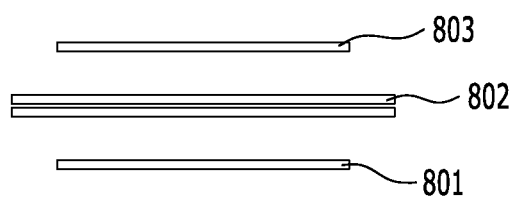
FIGS. 15A to 15D are diagrams illustrating a coil transmitter for wireless power transfer using a magnetic induction phenomenon in accordance with another embodiment of the present invention.
Figure 15B:
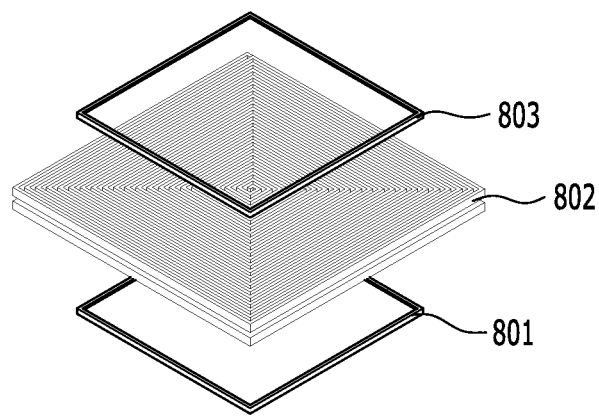

FIGS. 15A and 15B are diagrams illustrating a coil transmitter for wireless power transfer using a magnetic induction phenomenon in accordance with another embodiment of the present invention. Like reference numerals denote like elements in the accompanying drawings.

A feeding roof 503 is a square shaped coil where a transmission power is input to. A transmission end resonator 1510 is a resonator for input matching. The transmission end resonator 1510 has an impedance value for matching input signal.

A receiving magnetic induction roof 1511 is a receiving roof for collecting a magnetic field by a magnetic induction phenomenon.

FIG. 15A is a diagram for determining whether the magnetic induction can overcome the radiation problem through simulations. For simulation, the feeding roof 503 and the resonance coil 1510 are configured to induce an electric field for impedance matching. A reference numeral 1511 shows a shape collecting electric power in proportion to an amplitude of a magnetic field passing to an inside of the receiving roof.

Figure 15C:
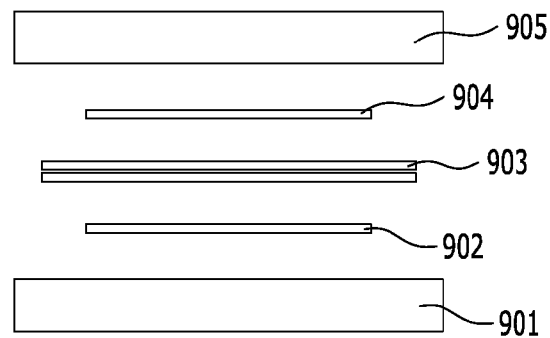
Figure 15D:
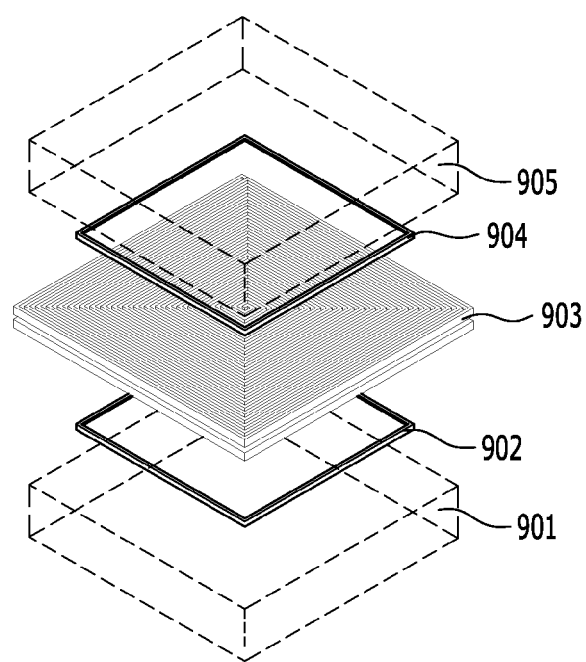

FIGS. 15C and 15D are diagrams illustrating an electric field shield included with the structure of FIGS. 15A and 15B.

As shown in FIGS. 15C and 15D, the electric field shields 1520 and 1521 are arranged at a rear side of the feeding roof 503 and a rear side of the receiving magnetic induction roof 1511. Further, water may be inserted in the inside of the electric field shields 1520 and 1521 as described above. Also, the same effect can be obtained by inserting a material having a comparative high dielectric loss in the electric field shield although a dielectric constant is low.

FIGS. 16A to 16D are graphs showing results of simulating an antenna radiation gain, a radiation power pattern, an electric field, and a magnetic field in the embodiment of the present invention of FIGS. 15A to 15B.

Figure 16A:
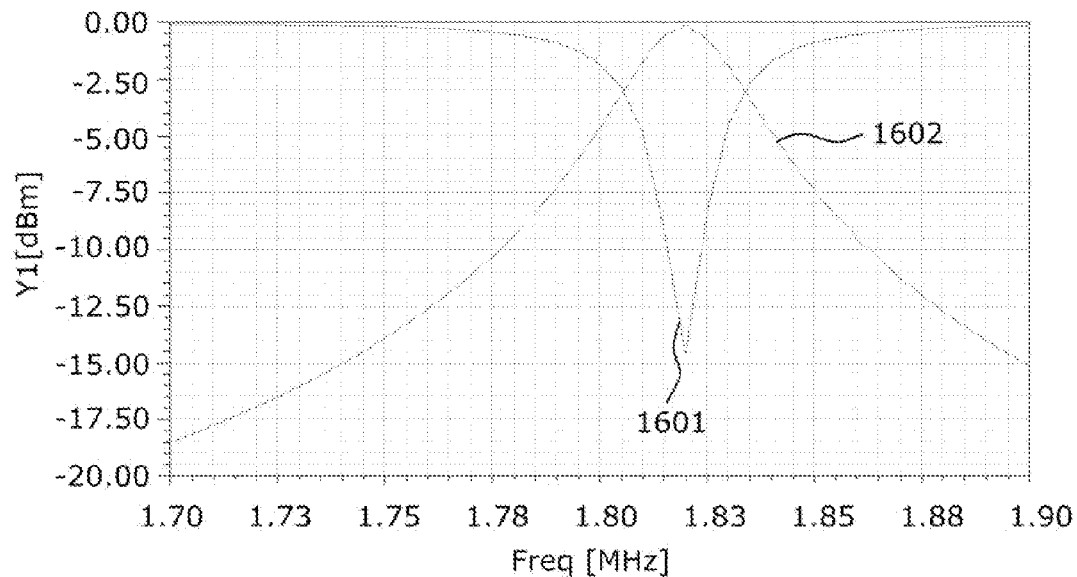
FIGS. 16A to 16D are graphs showing results of simulating an antenna radiation gain, a radiation power pattern, an electric field, and a magnetic field in the embodiment of the present invention of FIGS. 15A to 15B.

FIG. 16A is a graph illustrating a result of simulating a radiation gain with a s-parameter in an embodiment of the present invention of FIGS. 15A to 15B. The graph of FIG. 16A shows that the resonance frequency of the wireless energy transfer apparatus is about a band of 1.82000 MHz. Further, FIGS. 16A to 16D are simulation results for confirming whether the radiation problem can be overcame by an electric field shield in case of wireless energy transfer by magnetic induction.

A reference numeral 1601 is a graph showing a frequency response characteristic simulated with a S-parameter of S1,1 when an electric field is blocked by the shields of FIGS. 15A to 15B. A reference numeral 1602 is a graph illustrating a frequency response characteristic of S2, 1 in a wireless power transfer apparatus having the shields of FIGS. 15A to 15B. Here, the graph 1601 S1,1 shows that a resonance frequency is significantly decreased at about 1.8200 MHz. As shown, the resonance is occurred at 1.8200 MHz and maximum radiation is occurred from a transmission end to a receiving end thereby. That is, using the graph of FIG. 16A, it is observed whether the magnetic induction smoothly operates or not at 1.820 MHz band. Further, the structure thereof and a radiation gain are observed. As shown in the graph of FIG. 16A, a radiation gain is about −24.7 dBi.

The S(2,1) of s-parameter is an analysis value for power transfer when power is transferred from a first port to a second port. That is, FIG. 16A is a graph illustrating a simulation result of a gain in the wireless power transfer coil of FIGS. 15A to 15B when the power is transferred from the transmission end to the receiving end.

Figure 16B:
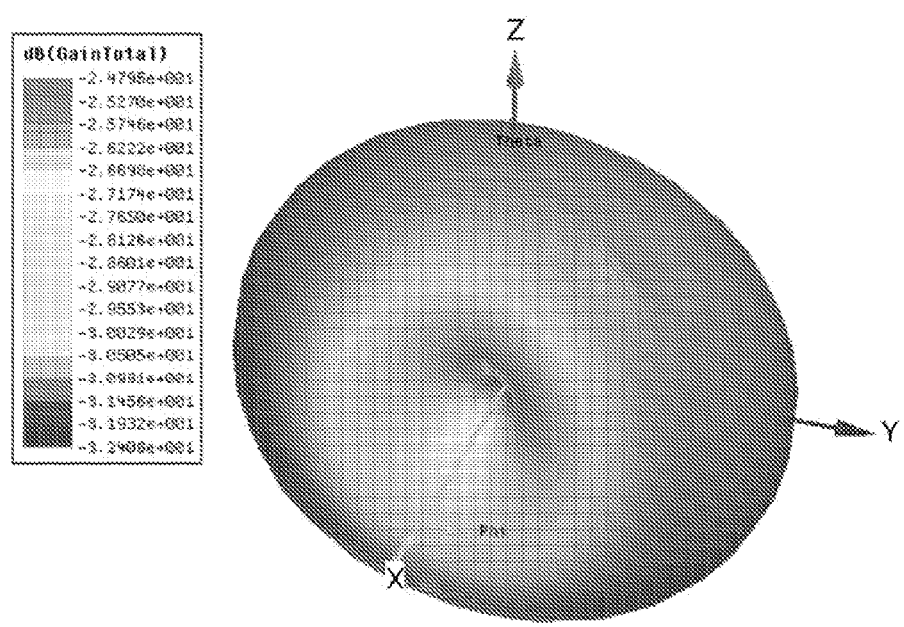

FIG. 16B is a graph showing a result of simulating a radiation power and a pattern thereof in the wireless power transfer coil shown FIGS. 15A to 15B. As shown in the simulation result graph of FIG. 16B, the radiation power is very smaller than that shown in FIG. 2A in case of the wireless power transfer coil without shields of FIGS. 15A to 15B.

Figure 16C:
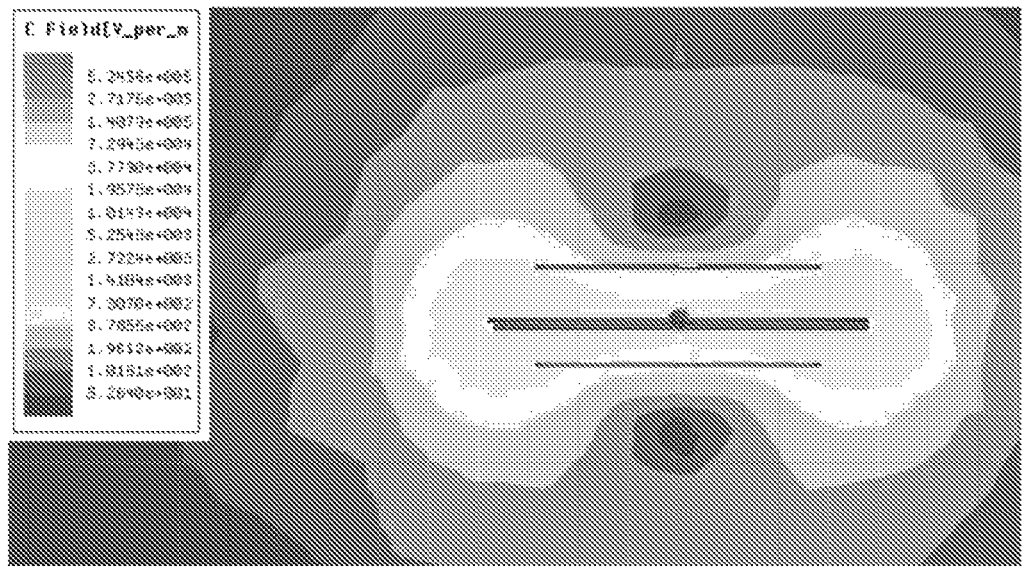
Figure 16D:
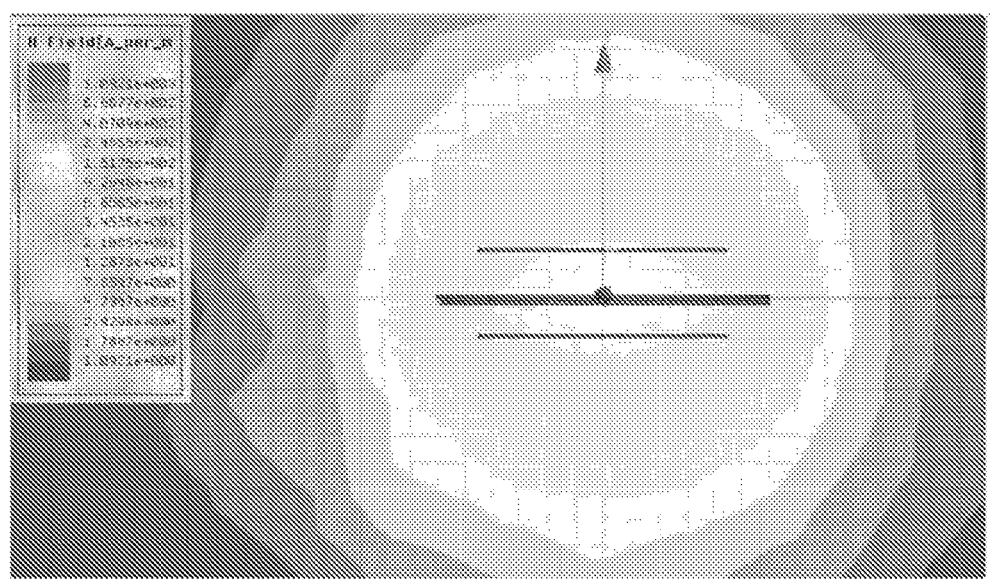

FIG. 16C is a graph illustrating a result of simulating an electric field in the wireless power transfer coil shown in FIGS. 15A to 15B. FIG. 16D is a graph illustrating a result of simulating a magnetic field in the wireless power transfer coil shown in FIGS. 15A to 15B. As shown in FIGS. 16C and 16D, the electric field characteristic and the magnetic field characteristic are widely distributed when an electric field shield is not used.

FIGS. 17A to 17D are graphs showing results of simulating an antenna radiation gain, a radiation power pattern, an electric field, and a magnetic field in the structure of FIGS. 15C and 15B.

Figure 17A:
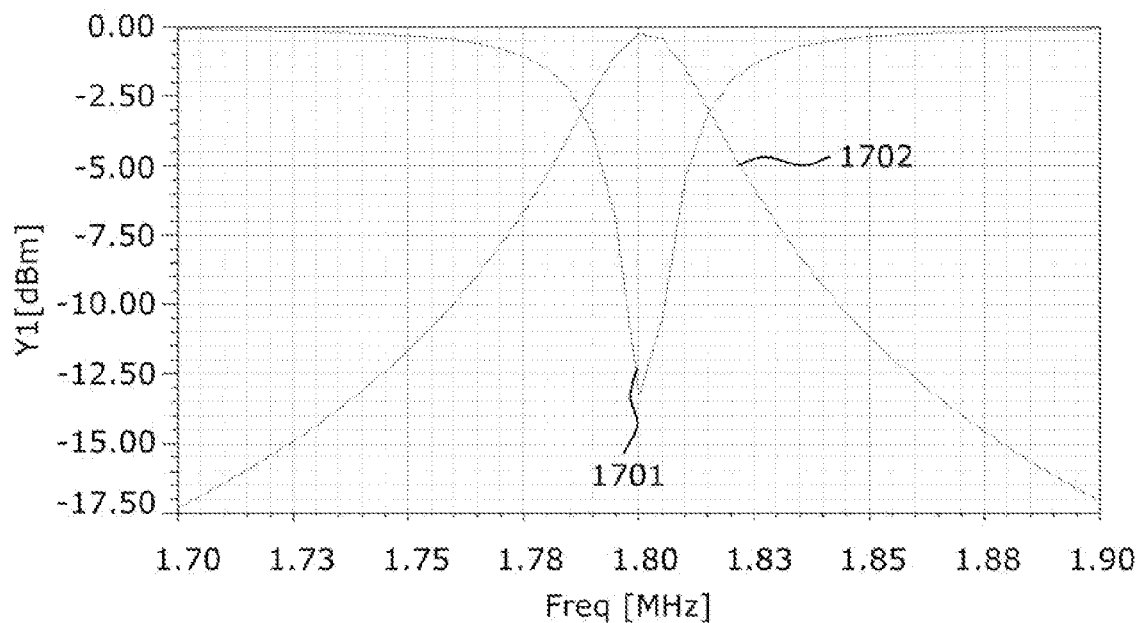
FIGS. 17A to 17D are graphs showing results of simulating an antenna radiation gain, a radiation power pattern, an electric field, and a magnetic field in the structure of FIGS. 15C and 15B.

FIG. 17A is a graph showing a result of simulating a radiation gain with S-parameter in the wireless power transfer coil of FIGS. 15C and 14D including the electric field shields 1520 and 1521. The shields 1520 and 1521 include dielectrics having the following conditions.

<Condition>
1. A dielectric constant is 5.
2. The dielectric has a high Loss tan value such as 0.1.
3. It is filled with a virtual material having the above conditions, not a real material.

The graph of FIG. 17A shows that the resonance frequency of the wireless energy transfer apparatus is about 1.8 MHz.

A reference numeral 1701 is a graph showing a frequency response characteristic simulated with a S-parameter of S1,1 in the wireless power transfer coil of FIGS. 15C and 15D including the electric field shields 1520 and 1521. A reference numeral 1702 is a graph illustrating a frequency response characteristic of S2, 1 in a wireless power transfer apparatus having the shields of FIGS. 11*a* to 11C. Here, the graph 1702 shows that a resonance frequency is significantly decreased at about 1.8 MHz. As shown, the resonance is occurred at 1.80 MHz and maximum radiation is occurred from a transmission end to a receiving end thereby.

Further, the radiation gain is about −42.2 dBi as shown in FIG. 17A. That is, the radiation gain is significantly reduced in comparison with that of FIG. 16A.

The S(2,1) of s-parameter is an analysis value for power transfer when power is transferred from a first port to a second port. That is, FIG. 17A is a graph illustrating a simulation result of a gain in the wireless power transfer coil of FIGS. 15C to 15D when the power is transferred from the transmission end to the receiving end.

Figure 17B:
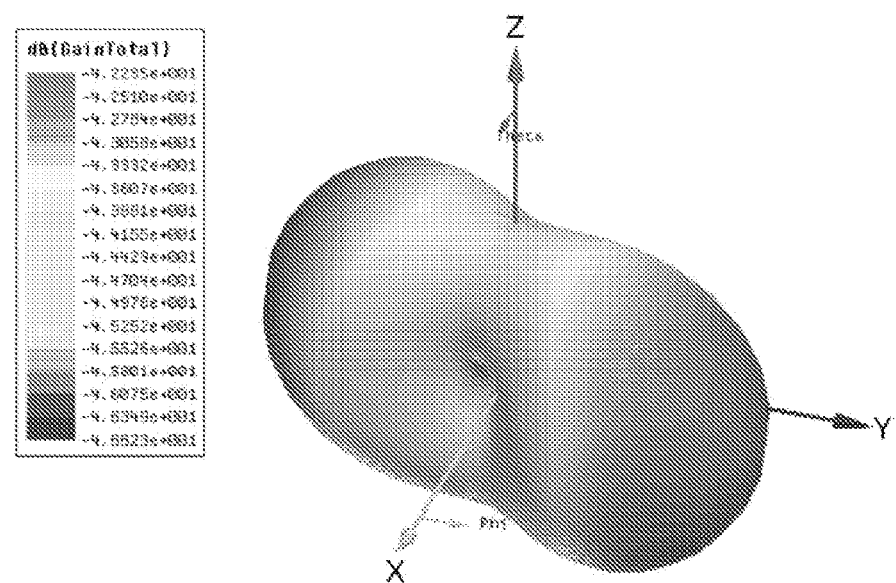

FIG. 17B is a graph showing a result of simulating a radiation power and a pattern thereof in a wireless power transfer coil of FIGS. 15C and 15D. As shown in the simulation result graph of FIG. 17B, there is no variation in energy transfer characteristics in comparison with the wireless energy transfer coil without shields of FIG. 16A.

Figure 17C:
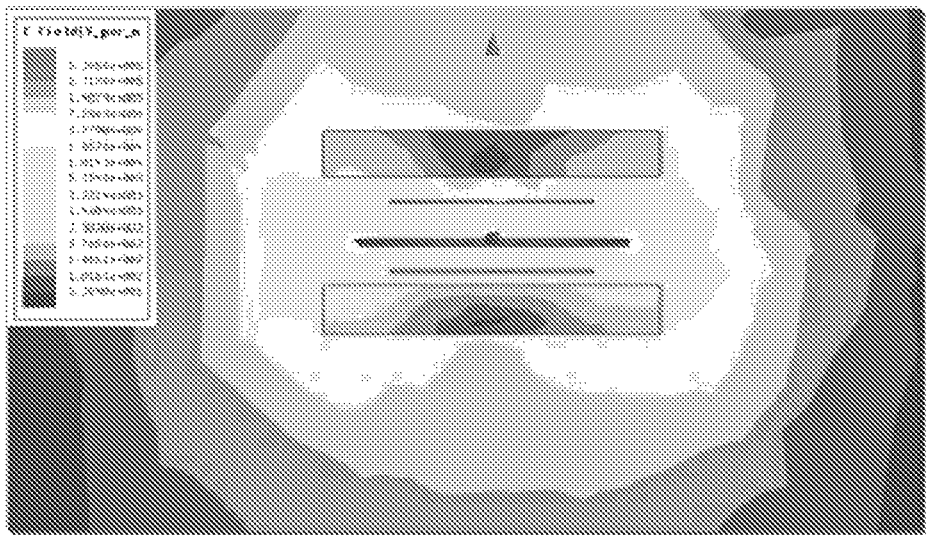
Figure 17D:
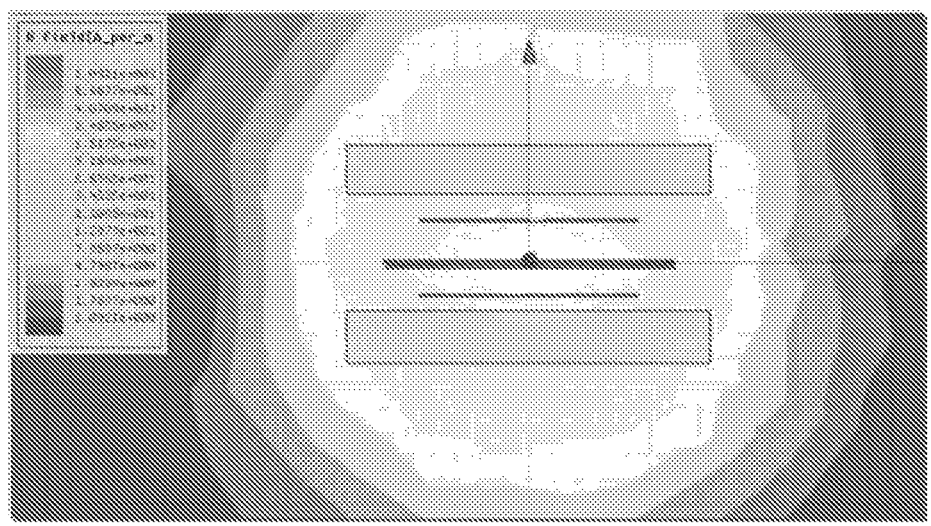

FIG. 17C is a graph illustrating a result of simulating an electric field in the wireless power transfer coil shown in FIGS. 15C and 15D. FIG. 17D is a graph illustrating a result of simulating a magnetic field in the wireless power transfer coil shown in FIGS. 15C and 15D. As shown in FIGS. 17C and 17D, the electric field is significantly decreased in a dielectric when the electric field shields 1520 and 1521 are used.

As described above, the wireless energy transfer apparatus in accordance with an embodiment of the present invention reduces the radiation gain by including the electric field shields and inserting a material having a comparative high dielectric constant or a comparative high dielectric loss value although a dielectric constant is low. Accordingly, the wireless energy transfer apparatus in accordance with an embodiment of the present invention may be effective solution for EMI countermeasure. That is, the wireless energy transfer apparatus in accordance with an embodiment of the present invention blocks the electric field and penetrates the magnetic field while transferring power wirelessly.

As described above, the present invention relates to a method for minimizing a radiation power and an electric field around an electric field resonator which is a major element in wireless power transfer. Therefore, the present invention provides a core technology for overcoming the interference problem causing bad influence to human body. The present invention may be implemented in general electronic devices.

Particularly, wireless power transfer implemented electric devices cannot be released to the market without solving fundamental inherent problems such as the power radiation problem, the safety problem, and the interference problem. Accordingly, the wireless energy transfer apparatus in accordance with an embodiment of the present invention is significantly meaningful as a radiation power reduction and electric field reduction technology because each country and standard organization defines a standard for an interference amount and an electric field exposure amount to obey.

Throughout the specification, a resonator may be magnetic resonant coupling coils or a magnetic induction device.

While the present invention has been described with respect to the specific embodiments, it will be apparent to those skilled in the art that various changes and modifications may be made without departing from the spirit and scope of the invention as defined in the following claims.

What is claimed is:

1. An apparatus for reducing an electric field and a radiation power in a magnetic resonator for wireless energy transfer, comprising:
a transmission end energy transfer unit configured to include a feeding roof and a transmission coil;
a receiving end energy transfer unit configured to have a symmetrical structure to the transmission end energy transfer unit, to be separated from the transmission end energy transfer unit at a predetermined distance, and to include a receiving roof and a receiving coil;
a first electric field shield configured to be made of a nonconductor, to have a shape surrounding the transmission end energy transfer unit, and to have an empty space of a predetermined first thickness; and
a second electric field shield to be made of a nonconductor, to have a shape surrounding the receiving end energy transfer unit, and to have an empty space of a predetermined second thickness,
wherein the empty spaces of the first and second electric field shields are filled with a dielectric material for shielding the electric field.

2. The apparatus of claim 1, wherein the first and second electric field shields have a shape of hexahedron.

3. The apparatus of claim 1, wherein the first and second electric field shields has a globular shape.

4. The apparatus of claim 1, wherein the transmission end energy transfer unit and the receiving end energy transfer unit include a resonance coil, and
wherein the resonance coil is made as a conductor plate having a predetermined width and a predetermined thickness and the resonance coil is configured as a circular spiral structure.

5. The apparatus of claim 1, wherein the transmission end energy transfer unit and the receiving end energy transfer unit include a resonance coil, and
wherein the resonance coil is made as a conductor plate having a predetermined width and a predetermined thickness and the resonance coil is configured as a square spiral structure.

6. The apparatus of claim 1, wherein the transmission end energy transfer unit and the receiving end energy transfer unit include a resonance coil, and
wherein the resonance coil is made as a conductor plate having a predetermined width and a predetermined thickness and the resonance coil is configured as a circular coil structure.

7. The apparatus of claim 1, further comprising:
a first electric field shield disposed at a rear side in a 180° direction from the transmission end energy transfer unit,
wherein the first electric field shield is made of a nonconductor and has an area greater than the transmission coil and the feeding roof, and
wherein the first electric field shield internally includes a dielectric having a dielectric loss higher than about 0.1.

8. The apparatus of claim 1, further comprising:
a second electric field shield disposed at a rear side in a 180° direction from the receiving end energy transfer unit,
wherein the second electric field shield is made of a nonconductor and has an area greater than the receiving coil and the receiving roof, and
wherein the second electric field shield internally includes a dielectric having a dielectric loss higher than about 0.1.

9. The apparatus of claim 1, further comprising:
a third electric field shield disposed at a gap between the transmission end energy transfer unit and the receiving end energy transfer unit,
wherein the third electric field shield is made of a nonconductor, and
wherein the third electric field shield internally includes a dielectric having a dielectric loss equal to or higher than about 0.1.

10. An apparatus for reducing an electric field and a radiation power in a magnetic resonator for wireless energy transfer, comprising:
a transmission end energy transfer unit configured to includes a feeding roof and a transmission coil;
a receiving end energy transfer unit configured to be formed symmetrical to the transmission end energy transfer unit, to be separated at a predetermined distance from the transmission end energy transfer unit, and to include a receiving coil and a receiving roof;
a first electric field shield configured to be disposed at a rear side in a 180° direction from the transmission end energy transfer unit, to be made of a nonconductor, and to have an area greater than the transmission coil and the feeding roof;
a second electric field shield configured to be disposed at a rear side in a 180° direction from the receiving end energy transfer unit, to be made of a nonconductor, and to have an area greater than the receiving coil and the receiving roof,
wherein the first electric field shield and the second electric field shield internally include a dielectric that shields an electric field.

11. The apparatus of claim 10, further comprising:
a third electric field shield configured to be disposed a gap between the transmission end energy transfer unit and the receiving end energy transfer unit,
wherein the third electric field internally include a dielectric that shields an electric field.

12. The apparatus of claim 10, wherein the transmission end energy transfer unit and the receiving end energy transfer unit include a resonance coil, and
wherein the resonance coil is made as a conductor plate having a predetermined width and a predetermined thickness and the resonance coil is configured as a circular spiral structure.

13. The apparatus of claim 10, wherein the transmission end energy transfer unit and the receiving end energy transfer unit include a resonance coil, and
wherein the resonance coil is made as a conductor plate having a predetermined width and a predetermined thickness and the resonance coil is configured as a square spiral structure.

14. The apparatus of claim 10, wherein the transmission end energy transfer unit and the receiving end energy transfer unit include a resonance coil, and
wherein the resonance coil is made as a conductor plate having a predetermined width and a predetermined thickness and the resonance coil is configured as a circular coil structure.

15. A method for reducing an electric field and a radiation power in a magnetic resonator for wireless energy transfer, wherein the magnetic resonator includes a transmission end energy transfer unit having a feeding roof and a transmission coil and a receiving end energy transfer unit symmetrically separated from the transmission end energy transfer unit and having a receiving coil and a receiving roof, the method comprising:
shielding an electric field of the transmission end energy transfer unit by filling a dielectric at an empty space between an inner wall and an outer wall of a first electric field shield made of a nonconductor and having a shape entirely surrounding the transmission end energy transfer unit; and
shielding an electric field of the receiving end energy transfer unit by filling a dielectric at an empty space between an inner wall and an outer wall of a second electric field shield made of a nonconductor and having a shape entirely surrounding the receiving end energy transfer unit.

16. The method of claim 15, wherein the first electric field shield and the second electric field shield are configured to have a shape of hexahedron.

17. The method of claim 15, wherein the first electric field shield and the second electric field shield are configured to have a globular shape.

18. A method for reducing an electric field and a radiation power in a magnetic resonator for wireless energy transfer, wherein the magnetic resonator includes a transmission end energy transfer unit having a feeding roof and a transmission coil and a receiving end energy transfer unit symmetrically separated from the transmission end energy transfer unit and having a receiving coil and a receiving roof, the method comprising:
disposing a first electric field shield at a rear side in a 180° direction from the transmission end energy transfer unit, wherein the first electric field shield has an area greater than the transmission coil and the feeding roof, is made of a nonconductor, and internally includes a dielectric shielding an electric field; and
disposing a second electric field shield at a rear side in a 180° direction from the receiving end energy transfer unit, wherein the second electric field shield has an area greater than the receiving coil and the receiving roof, is made of a nonconductor, and internally includes a dielectric shielding an electric field.

19. The method of claim 18, wherein the first electric field shield and the second electric field shield are configured to have a shape of hexahedron.

20. The method of claim 18, further comprising:
disposing a third electric field shield at a gap between the transmission end energy transfer unit and the receiving end energy transfer unit,
wherein the third electric field is configured to have a hexahedron shape and internally includes a dielectric that shield an electric field.

* * * * *